(12) United States Patent
Bilbao De Mendizabal

(10) Patent No.: US 11,852,555 B2
(45) Date of Patent: Dec. 26, 2023

(54) STRAY-FIELD-IMMUNE MAGNETIC FIELD SENSOR ARRANGEMENT, MAGNETIC TORQUE SENSOR ARRANGEMENT AND METHOD FOR DETERMINING A MAGNETIC FLUX

(71) Applicant: MELEXIS TECHNOLOGIES SA, Bevaix (CH)

(72) Inventor: Javier Bilbao De Mendizabal, Zurich (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 368 days.

(21) Appl. No.: 16/904,162

(22) Filed: Jun. 17, 2020

(65) Prior Publication Data

US 2020/0400516 A1   Dec. 24, 2020

(30) Foreign Application Priority Data

Jun. 21, 2019   (EP) .................................... 19181624

(51) Int. Cl.
  *G01L 3/10*   (2006.01)
  *G01B 7/30*   (2006.01)
  (Continued)

(52) U.S. Cl.
  CPC ................ *G01L 3/101* (2013.01); *G01B 7/30* (2013.01); *G01D 5/145* (2013.01); *G01R 33/077* (2013.01)

(58) Field of Classification Search
  CPC .......... G01L 3/101; G01B 7/30; G01D 5/145; G01R 33/077
  See application file for complete search history.

(56) References Cited

U.S. PATENT DOCUMENTS 5,568,048 A * 10/1996 Schroeder .............. G01D 5/145
                                                      324/252
6,880,411 B2   4/2005 Nakane et al.
(Continued)

FOREIGN PATENT DOCUMENTS

DE       10222118 A1    11/2002
DE    102015122179  *   6/2017  ............... G01B 7/30
(Continued)

OTHER PUBLICATIONS

Search Report from European Application No. 19181624.8, dated Dec. 2, 2019.

*Primary Examiner* — Alexander Satanovsky
*Assistant Examiner* — Sharah Zaab
(74) *Attorney, Agent, or Firm* — WORKMAN NYDEGGER

(57) ABSTRACT

A magnetic field sensor arrangement for determining a signal magnetic flux in a manner which is substantially strayfield immune, comprises: a signal magnetic field source; a first and second magnetic flux concentrator forming an air gap between exterior faces of the magnetic flux concentrators; the flux concentrators being configured for guiding a signal magnetic flux to and across the air gap in a gap direction; a magnetic field sensor arranged inside the air gap, and configured for measuring a first and second signal in the gap direction and perpendicular to the gap direction; and for reducing or eliminating an magnetic disturbance field based on the first and second signal. An angle sensor arrangement. A torque sensor. A method of measuring a signal flux, an angle, a torque in a substantially strayfield immune manner.

15 Claims, 13 Drawing Sheets

(51) Int. Cl.
*G01D 5/14* (2006.01)
*G01R 33/07* (2006.01)

(56) References Cited

U.S. PATENT DOCUMENTS

| | | | |
|---|---|---|---|
| 7,047,824 B2 | | 5/2006 | Nakane et al. |
| 7,089,809 B2 | | 8/2006 | Nakane et al. |
| 2003/0112004 A1 | * | 6/2003 | Luetzow ................ G01D 5/145 |
| | | | 324/207.13 |
| 2010/0005909 A1 | | 1/2010 | Antoni et al. |
| 2010/0188078 A1 | * | 7/2010 | Foletto ............... G01R 33/0005 |
| | | | 324/252 |
| 2011/0308330 A1 | * | 12/2011 | May ........................ G01L 3/102 |
| | | | 73/862.69 |

FOREIGN PATENT DOCUMENTS

| | | | | | |
|---|---|---|---|---|---|
| DE | 102015122179 A1 | | 6/2017 | | |
| EP | 2708854 | * | 3/2014 | ............... | G01D 5/14 |
| EP | 2708854 A1 | | 3/2014 | | |
| EP | 2775314 | * | 9/2014 | ............ | G01R 33/00 |
| EP | 3505894 A1 | | 7/2019 | | |

\* cited by examiner a) providing a magnetic structure (110) comprising a magnetic field source (S1) and two magnetic concentrators configured for guiding a magnetic flux generated by said source, and forming an air gap (203) oriented in a radial direction (X) w.r.t. to the magnetic structure (110) — 1201 b) measuring, inside the air gap (203), a first magnetic field component (Bx) oriented in the radial direction (X), indicative of a combination of a signal generated by the magnetic source and a first portion (228) of a disturbance field oriented in the axial direction (Z) w.r.t. the magnetic structure (110) — 1202 c) measuring, inside the air gap (203), a second magnetic field component (Bz) oriented in an axial direction (Z) of the magnetic structure (110), indicative of a second portion (229) of said disturbance field oriented in the axial direction (Z) — 1203 d) reducing or eliminating the first disturbance portion (228) by scaling the second signal (Bz) with a predefined constant (K), and by subtracting the scaled signal from the first signal (Bx) — 1204 e) converting the corrected first signal into an angular distance value, and/or into a torque value, e.g. using a mathematical expression or a look-up table — 1205

STRAY-FIELD-IMMUNE MAGNETIC FIELD SENSOR ARRANGEMENT, MAGNETIC TORQUE SENSOR ARRANGEMENT AND METHOD FOR DETERMINING A MAGNETIC FLUX

FIELD OF THE INVENTION

The present invention relates in general to the field of magnetic field sensor arrangements, and in particular to a magnetic field sensor arrangement for determining a magnetic flux generated by a magnetic field source while being essentially immune to magnetic disturbance or stray fields generated by another magnetic field source. The present invention also relates to a magnetic torque sensor arrangement being immune to magnetic disturbance or stray fields. Furthermore, the present invention relates to a stray-field-immune method for determining a magnetic flux generated by a magnetic field source while being essentially immune to a magnetic disturbance or stray field generated by another magnetic field source.

BACKGROUND OF THE INVENTION

Magnetic sensor systems, in particular linear position sensor systems and angular/rotary position sensor systems, are known in the art. They offer the advantage of being able to measure a linear or angular position by means of a magnetic field sensor arrangement without making physical contact, thus avoiding problems of mechanical wear, scratches, friction, etc.

For example, the measurement of rotation angle is required in various applications, such as manual electrical switches or position and/or torque detection of a motor shaft, a valve and the like.

For example, from DE 102 22 118 A1 a magnetic sensor system for determining a torque being applied to a steering column of a vehicle is known, comprising a magnetic field sensor arrangement by means of which an angular displacement between an input shaft portion and an output shaft portion of the steering column is determined using a magnetic field. The magnetic field to be measured and being representative of the angular displacement between the two shaft portions is generated by a magnetic field source, e.g. a (multi-pole) permanent ring magnet, which is (directly or indirectly) connected to one of the input and output shafts in a rotatably fixed manner. The magnetic flux of the generated magnetic field is received and guided by two appropriately shaped magnetic flux concentrators, one of which is non-rotatably fixed to the input shaft and the other one is non-rotatably fixed to the output shaft. A magnetic field sensor measures the magnetic flux in an air gap which is formed between the two flux concentrators, wherein the magnetic flux in the air gap varies as a function of the angular displacement between the input and output shaft portions.

EP3505894 describes a torque sensor comprising a multi-pole ring magnet and two magnetic yokes respectively connected to an input shaft and an output shaft. These yokes have protrusions forming an air gap. A sensor device is placed in this air gap for measuring a flux density variation indicative of an angular displacement between the two yokes, the angle itself being indicative of a torque being exerted upon the input and output shaft. This torque sensor is designed for reducing or eliminating assembling errors but is not immune against an external disturbance field.

With the increase of compactness of electrical systems, particularly in automobiles with the arrival of hybrid engine systems or purely electric power trains, such magnetic sensor systems are often additionally exposed to external magnetic fields from nearby current conductors carrying strong currents (e.g. more than 100 A). Such external magnetic fields—herein also referred to as (external) magnetic disturbance fields or (external) magnetic stray fields—being generated by an external magnetic field source (herein also referred to as a disturbance magnetic field source), for example the afore-mentioned current conductors passing nearby the actual magnetic sensor system, may corrupt the measurement values to be determined by the magnetic sensor system, thus deteriorating the accuracy of the linear or angular/rotary position to be determined.

It is a challenge to build a magnetic sensor system that is substantially immune, i.e. substantially insensitive, to such external magnetic disturbance fields or external magnetic stray fields.

There is always room for improvements or alternatives.

SUMMARY OF THE INVENTION

It is an object of embodiments of the present invention to provide a magnetic field sensor arrangement and a method for determining a magnetic flux (e.g. a magnetic flux generated by a magnetic field source and modulated by a magnetic structure) while being substantially immune to (external) magnetic disturbance fields, in particular to a substantially homogeneous magnetic disturbance field.

It is an object of embodiments of the present invention to provide an angle sensor arrangement, and a method for determining an angular displacement in a manner which is substantially immune to (external) magnetic disturbance fields, in particular a substantially homogeneous magnetic disturbance field.

It is an object of embodiments of the present invention to provide a magnetic torque sensor arrangement, and a method for determining a torque in a manner which is substantially immune to (external) magnetic disturbance fields, in particular a substantially homogeneous magnetic disturbance field.

It is an object of embodiments of the present invention to provide a magnetic sensor arrangement, and/or an angle sensor arrangement and/or a magnetic torque sensor arrangement adapted for providing highly accurate measurement results (e.g. angular displacement, and/or a torque measurement) even in the presence of (external) magnetic disturbance fields, and to a method having the same properties for stray-field-immune determining a magnetic flux.

It is an object of embodiments of the present invention to provide a magnetic sensor arrangement, and a magnetic torque sensor arrangement having a compact construction, therefore requiring only a small installation space.

It is an object of embodiments of the present invention to provide a magnetic sensor arrangement, a magnetic torque sensor arrangement, and a method for stray-field-immune determining a magnetic flux which require only relatively simple arithmetic (such as for example addition, subtraction, multiplication, division, a look-up table, interpolation) that can be performed on a simple microprocessor or microcontroller, but not including a Discrete Fourier-Transform (DFT) or Fast Fourier Transform (FFT) which typically require a digital signal processor (DSP) and typically also require considerably more memory capacity, e.g. RAM, ROM, Flash and the like.

It is an object of embodiments of the present invention to provide a torque sensor, for measuring a torque exerted upon an input shaft and an output shaft, in a manner which is highly insensitive to a homogeneous disturbance field.

These and other objectives are accomplished by a magnetic field sensor arrangement for stray-field-immune determining a magnetic flux, a magnetic torque sensor arrangement for stray-field-immune determining a torque, and a method of stray-field-immune determining a magnetic flux according to embodiments of the present invention.

It is to be noted that the individual features listed in the description below can be combined in any technically meaningful way with each other and show further embodiments of the invention. The description of the invention is additionally characterized and specified particularly in connection with the figures.

Furthermore, it is to be noted that a conjunction "and/or" used herein to combine a first and a second feature is to be construed always as disclosing a first embodiment of the present invention that may comprise only the first feature, a second embodiment of the present invention that may comprise only the second feature, and a third embodiment of the present invention that may comprise both the first and second features.

According to a first aspect, the present invention provides a magnetic field sensor arrangement for determining a signal magnetic flux generated by a signal magnetic field source in a manner which is substantially immune against a magnetic disturbance field; the magnetic field sensor arrangement comprising: said signal magnetic field source; a first and a second magnetic flux concentrator configured and arranged such that an air gap is formed between an exterior face of the first magnetic flux concentrator and an exterior face of the second magnetic flux concentrator, wherein the first and second exterior face define a first direction of the air gap by a line of shortest distance between said exterior faces; wherein the first and second magnetic flux concentrator are configured for guiding a signal magnetic flux generated by the signal magnetic field source to and across the air gap substantially in the first direction; a magnetic field sensor comprising a plurality of sensor elements arranged inside the air gap; wherein the magnetic field sensor is configured for measuring a first signal indicative of a magnetic field component oriented in the first direction, and for measuring a second signal indicative of a magnetic field component oriented in a second direction substantially perpendicular to the first direction; and wherein the magnetic field sensor is further configured for reducing or substantially eliminating an influence of a magnetic disturbance field, if present, based on the first signal and the second signal.

Both exterior faces are respective exterior faces of the first and second magnetic flux concentrators, respectively, which have a minimum distance therebetween. Or stated in other terms, an "air gap" is formed between a surface region of the first magnetic flux concentrator and a surface region of the second magnetic concentrator, at a location where the distance between the first and second magnetic flux concentrator is smallest (because this is where a majority of the flux lines will pass).

A "gap direction" of the air gap is defined by the line of shortest length (or shorted distance) between those two exterior faces, i.e. the exterior face of the first magnetic flux concentrator and the exterior face of the second magnetic flux concentrator forming and delimiting the air gap with regard to at least one spatial direction.

While the magnetic flux concentrators are "intended" to only guide the magnetic flux generated by the signal magnetic source (e.g. a multi-pole ring magnet), in practice, in the presence of an external disturbance field, the first and second magnetic flux concentrator will also receive and guide a first portion of this external magnetic disturbance field through the gap in the first direction, which will influence the first signal. A second portion of the disturbance field crosses the air gap from a direction different from the gap direction, e.g. substantially perpendicular to the gap direction, or from a direction whose line-of-sight—at least within the area of a cross section of the air gap which is crossed by the second disturbance magnetic flux—is not obstructed by any of the first and second magnetic flux concentrators. Accordingly, although the second portion of the disturbance flux might be slightly influenced by the presence of the first and/or second magnetic flux concentrators in the vicinity of the air gap, it is by no means received by and guided within the first and second magnetic flux concentrator to the air gap in the gap direction.

Importantly, the magnetic sensitive elements of the sensor device are arranged inside the air gap, such that it is able to sense the "signal magnetic flux and the first disturbance magnetic flux" in the first sensing direction, and the "second disturbance magnetic flux" in the sensing direction. With "arranged in the air gap" is meant that the sensor device is arranged such that all its magnetic sensitive elements (e.g. Hall plates) are located inside a "virtual channel" where most of the flux passes from the first flux conductor to the second flux conductor. This "virtual channel" is located between the first and the second exterior face.

Or stated in other words, the sensor device is adapted for measuring the superposition of the desired flux (e.g. originating from a magnet) and said (undesired) "first portion" of the disturbance field in a first direction, and for measuring said "second portion" of the disturbance field in the second direction. Said first portion and said second portion are related to each other, e.g. are proportional to each other. The measurement of the second portion can be used to estimate the first portion, which can then be subtracted from the measured signal in order to determine the (desired) signal magnetic flux. Depending on the application, the "signal magnetic flux" may be indicative of a linear or an angular position. By reducing or substantially eliminating the influence from the disturbance field, the signal magnetic flux, or the linear or angular position, can be more accurately determined, even in the presence of a magnetic disturbance field.

It is an important advantage of the magnetic field sensor arrangement according to the present invention that the magnetic field sensor is arranged in the air gap so that it is able to sense, in its first sensing direction, both the signal magnetic flux and the first disturbance magnetic flux (or "first portion") entering and crossing the air gap in their superimposed state essentially in the gap direction by crossing the gap-delimiting exterior faces of both magnetic flux concentrators, and, is able to sense, at the same time, in its second sensing direction, the second disturbance magnetic flux (or "second portion") entering the air gap independently from the signal magnetic flux from a spatial direction different from the gap direction, (e.g. substantially perpendicular to the gap direction) because in this way the amount of the external disturbance magnetic flux, i.e. the disturbance magnetic flux being present in the surroundings of the actual magnetic field sensor arrangement at a given time, can be determined by the magnetic field sensor in its second sensing direction, thus facilitating the determination of the amount of the first disturbance magnetic flux superimposing the signal magnetic flux within the first and second magnetic flux concentrators being sensed by the magnetic field sensor in its first sensing direction. Knowing the actual amount of the first disturbance magnetic flux renders possible the elimination (or at least a considerable suppression) of the influence of the external disturbance magnetic field generated by the disturbance magnetic field source from the overall magnetic flux (signal magnetic flux as well as first disturbance magnetic flux) sensed in the first sensing direction, thus facilitating the determination of the true signal magnetic flux being received by and guided within the first and second magnetic flux concentrators. As a result, facilitating to isolate the disturbance quantity generated by the disturbance magnetic field source, the magnetic field sensor arrangement according to the invention is made substantially insensitive or immune to external magnetic stray/disturbance fields.

Or stated in other words, by measuring the "second portion" of the disturbance field, for example in a direction substantially perpendicular to the gap direction, the magnitude of the "first portion" of the disturbance field can be determined or at least estimated. By subtracting this estimated first portion, the influence from the disturbance field can be substantially reduced or even completely eliminated. This is particularly true for a homogeneous disturbance field.

It is an advantage of the magnetic field sensor arrangement according to the invention that the determination of the signal magnetic flux is essentially insensitive to external magnetic stray/disturbance fields, resulting in considerably more accurate measuring and determination results.

Or formulated more specifically for a sensor arrangement being used for measuring a torque, it is an advantage that the torque can be determined with higher accuracy, in a manner which is less sensitive (e.g. substantially insensitive) to a magnetic disturbance field, in particular a homogeneous disturbance field.

Yet further, it is an advantage of the magnetic field sensor arrangement according to the present invention that the signal magnetic flux can be determined using a relatively simple controller (e.g. microcontroller) and does not require a powerful processor, because the mathematics required for determining the signal magnetic flux can for example be based on basic operations like additions, subtractions, multiplications, divisions, a goniometric function and/or a look-up table, but does not require for example a Discrete Fourier Transform (DFT). It is noted that also the goniometric function itself can be performed using a look-up table and optional interpolation.

It is a further advantage of the magnetic field sensor arrangement according to the present invention that the stray-field-immunity is achieved by a new arrangement and/or orientation of both the first and second magnetic flux concentrators and the magnetic field sensor, particularly by orienting the air gap and the gap direction, respectively, in a manner disclosed herein so that on the one hand the signal magnetic flux (e.g. generated by a multipole magnet) combined with the first disturbance magnetic flux (e.g. a first portion of a disturbance field, e.g. of a substantially homogeneous disturbance field), and on the other hand the second disturbance magnetic flux (e.g. a second portion of said disturbance field) alone cross the air gap independently of each other in two different spatial directions, which facilitates a highly compact design requiring only a small installation space. In preferred embodiments, the sensor device is implemented on a single semiconductor substrate arranged in said air gap.

The expression "substantially perpendicular" is to be understood to comprise an angular dimension of 90° as well as slight deviations from 90° which are within common tolerance limits accorded to the manufacturing of the magnetic field sensor, hence, which are not the result of a targeted action. Such deviations may include angular ranges between approximately 85° and 95°, preferably between 87° and 93°, yet more preferably between 89° and 91°.

It is an advantage of the present invention that the second signal can be used to reduce or substantially eliminate the first portion of an external disturbance field, based on the measured first and the second magnetic field component in said first and second direction.

Without loss of generality and without being restricted thereto, the disturbance magnetic field may be generated by a current conducting wire. Even though strictly speaking the magnetic field created by this current does not create a homogeneous field, in practice the magnetic disturbance field can be considered to be "substantially homogeneous" at a sufficient distance from said conductor, e.g. at least 10 cm, or at least 20 cm from said current conductor. In other words, in addition to the magnetic flux provided by the magnetic source (e.g. a permanent magnet), a first portion of the disturbance field is also received by and guided within the first and second magnetic flux concentrators together with the signal magnetic flux, thus obscuring the actual signal magnetic flux.

It is an advantage of the arrangement of the magnetic field sensor having its first sensing direction substantially aligned with the gap direction in that it facilitates (on the one hand) the magnetic field sensor to sense the signal magnetic flux superimposed by the first disturbance magnetic flux in the first sensing direction (equal to the gap direction), as well as (on the other hand) the second disturbance magnetic flux in the second sensing direction, independently of each other, and providing the highest possible measuring signal. Thus, measurement accuracy of the magnetic field sensor arrangement according to this embodiment is further improved.

In an embodiment, the magnetic field sensor is configured to reduce or substantially eliminate the influence of said magnetic disturbance field, if present, by scaling the second signal with a predefined constant, and by subtracting the scaled signal from the first signal.

This functionality may be implemented in analog or in digital circuitry. This processing circuitry is preferably also embedded in the same magnetic field sensor, preferably on the same semiconductor substrate. It is noted that this processing circuit may, but need not be located inside the air gap. It suffices that the magnetic sensitive elements are located inside the air gap.

In an embodiment, the magnetic field sensor further comprises a processor unit and a memory unit.

It is to be noted that a certain magnetic gain (magnetic amplification) caused by the flux concentrator guiding the first disturbance magnetic flux may be taken into account before subtracting the unamplified external second disturbance magnetic flux which is sensed in the second sensing direction. Such amplification factors between the first and second disturbance magnetic fluxes may be determined through calibration or parameterization of the magnetic field sensor arrangement and may be stored in a non-volatile memory of the memory unit afterwards, e.g. during production, or during a calibration procedure. Integrating the processor unit and the memory unit together with the magnetic sensor on a single semiconductor substrate, further improves the compact design of the magnetic field sensor arrangement according to this invention.

According to a second aspect, the present invention provides an angle sensor arrangement, comprising: a magnetic field sensor arrangement according to the first aspect; a first ring comprising a plurality of claws, the first ring being arranged adjacent the first flux concentrator; a second ring comprising a plurality of claws, the second ring being arranged adjacent the second flux concentrator; the first and second ring being movable about a rotation axis, and movable relative to each other; and wherein the magnetic field sensor is further configured for converting the signal magnetic flux into an angular distance signal, indicative of an angular distance between the first ring and the second ring.

It is to be noted that with regard to the effects and advantages of the features regarding the angle sensor arrangement disclosed herein, reference is made in its entirety to the corresponding, analogous features of the magnetic field sensor arrangement disclosed herein as well as to their effects and advantages.

The signal magnetic field source may be a multi-pole ring magnet. The ring magnet may be radially magnetised. The first and second ring may be rotatable with respect to one another about a rotation axis. The first and second ring may have a plurality of protrusions or pads or claws extending in the axial direction. These protrusions or pads or claws may have a geometry which corresponds to a geometry of the multi-pole ring magnet, especially in terms of the number of poles and the number of pads, e.g. similar or identical to what is described in DE10222118A1 or EP3505894A1. When the first ring rotates relative to the second ring, the magnetic flux generated by the signal source is modulated as function of the angular displacement. The ring magnet may be fixedly connected (directly or indirectly) to one of the rings.

In an embodiment, the magnetic field sensor is configured for measuring the first magnetic field component in a radial direction with respect to said rotation axis; and wherein the magnetic field sensor is configured for measuring the second magnetic field component in an axial direction parallel to said rotation axis.

In an embodiment, the exterior face of the first magnetic flux concentrator is provided on a section of the first magnetic flux concentrator having a protrusion or a bent portion or an L-shaped cross section in a plane containing the rotation axis and the first direction (or gap direction).

In a further or another embodiment, the exterior face of the second magnetic flux concentrator is provided on a section of the second magnetic flux concentrator having an L-shaped cross section in a plane containing the rotation axis and the first direction (or gap direction).

It is to be understood that the respective section of the first and/or second magnetic flux concentrator providing the respective exterior face which delimits the air gap with respect to the gap direction may also be referred to as a section of the respective magnetic flux concentrator in the vicinity of or adjacent to the air gap. The relevant cross section is taken from an intersecting plane in the direction of the gap direction.

In an embodiment, the L-shaped section of the first and/or second magnetic flux concentrator comprises a long leg and a short leg, wherein the long leg is longer than the short leg and wherein the long leg is oriented essentially perpendicular to the gap direction.

With regard to the meaning of the expression "essentially perpendicular", reference is made to the explanation set forth above holding true throughout this entire specification. Analogously, according to the present invention, the relative term "longer" is to be construed in the sense that a difference in the length between the long leg and the short leg is certainly not within common tolerance limits accorded to the manufacturing of the first and/or second magnetic flux concentrator, but is the result of a targeted action. As an example, the longer leg may be at least 10% or at least 20% longer than the short leg.

According to the above-described L-shaped configuration and arrangement, the second disturbance magnetic flux can reach and cross the air gap essentially perpendicularly to the gap direction without being received by and particularly without being guided within the first and/or second magnetic flux concentrator. If at all, the first and/or second magnetic flux concentrator, particularly the L-shaped section thereof, affects the second disturbance magnetic flux at most in an insignificant way. Thus, the line-of-sight in the direction in which the second disturbance magnetic flux enters and crosses the air gap is not obstructed by the first and/or second magnetic flux concentrator, consequently facilitating the magnetic field sensor to accurately sense/measure/determine the second magnetic disturbance flux being present and extending outside of the first and second magnetic flux concentrators.

In an embodiment, the exterior face of the first magnetic flux concentrator is provided on a section of the first magnetic flux concentrator forming a free end of the first magnetic flux concentrator.

In an embodiment, the exterior face of the second magnetic flux concentrator is provided on a section of the second magnetic flux concentrator forming a free end of the second magnetic flux concentrator.

In this way, improved control is given over the direction in which the magnetic flux (signal magnetic flux as well as first disturbance magnetic flux) guided by and within the first and/or second flux concentrator is directed into the air gap, i.e. preferably substantially oriented in the gap direction. As mentioned above, the gap direction is preferably oriented substantially in a plane perpendicular to an axial direction of the magnetic arrangement. The gap direction may for example be oriented substantially in a radial direction. This axial direction may be parallel to the above-mentioned input shaft and output shaft, if present. Thus, improved concentration of the magnetic flux crossing the air gap between the exterior face of the first magnetic flux concentrator and the exterior face of the second magnetic flux concentrator is achieved.

In an embodiment, the exterior face of the first magnetic flux concentrator is provided on a section of the first magnetic flux concentrator comprising at least one fin-shaped elongation member.

In an embodiment, the exterior face of the second magnetic flux concentrator is provided on a section of the second magnetic flux concentrator comprising at least one fin-shaped elongation member, wherein the at least one fin-shaped elongation member extends in a direction oriented essentially perpendicular to the first direction beyond a width and/or a height of a cross-sectional area of the air gap, wherein the cross-sectional area of the air gap extends essentially perpendicular to the first direction.

It is an advantage of this embodiment that the at least one elongation member provides even further improved control over the direction of the external disturbance magnetic flux originating from the disturbance magnetic field source and entering the air gap from outside where it is sensed by the magnetic field sensor by its second sensing direction. Additionally, depending on the spatial extent of the fin-shaped elongation member, it may provide a certain shielding effect, if so desired, in order to prevent a disturbance magnetic flux other than the first and second disturbance magnetic fluxes as well as originating from a spatial direction which is perpendicular to the second disturbance magnetic flux direction from being sensed by the magnetic field sensor in the air gap although this magnetic flux substantially does not compromise the signal magnetic flux which is to be determined by the angle sensor arrangement (e.g. as part of a torque sensor). Thus, accuracy of determining the signal magnetic flux is further improved.

In an embodiment, the magnetic field sensor comprises a semiconductor substrate substantially located inside the air gap, and oriented such that the axial direction is perpendicular to the semiconductor substrate, and wherein the semiconductor substrate comprises an integrated magnetic concentrator (IMC) and at least two horizontal Hall elements arranged at a periphery of the IMC.

In an embodiment, the magnetic field sensor comprises a semiconductor substrate substantially located inside the air gap, and oriented such that the first direction is perpendicular to the semiconductor substrate, and wherein the semiconductor substrate comprises an integrated magnetic concentrator (IMC) and at least two horizontal Hall elements arranged at a periphery of the IMC.

In an embodiment (e.g. as illustrated in FIG. 4(a)), the magnetic field sensor comprises a semiconductor substrate substantially located inside the air gap, and oriented such that the semiconductor substrate is perpendicular to the axial direction, and wherein the semiconductor substrate comprises a horizontal Hall element and a vertical Hall element.

In an embodiment (e.g. as illustrated in FIG. 4(b)), the magnetic field sensor comprises a semiconductor substrate substantially located inside the air gap, and oriented such that the semiconductor substrate is parallel to the axial direction and parallel to the first direction, and wherein the semiconductor substrate comprises a first vertical Hall element sensitive in the first direction, and a second vertical Hall element sensitive in the axial direction.

In an embodiment (e.g. as illustrated in FIG. 3(c)) the magnetic field sensor comprises a semiconductor substrate substantially located inside the air gap, and oriented such that the semiconductor substrate is perpendicular to the radial direction, and wherein the semiconductor substrate comprises a horizontal Hall element and a vertical Hall element.

In other words, the sensor device may comprise for example an integrated magnetic concentrator (IMC) and two horizontal Hall elements arranged at a periphery of said IMC, for determining a magnetic field component oriented perpendicular to the semiconductor substrate (e.g. by adding the signals from the two Hall elements) and for determining a magnetic field component parallel to the semiconductor substrate (e.g. by subtracting the signals from the two Hall elements), but the present invention is not limited hereto, and a sensor device with a horizontal Hall element and a vertical Hall element can also be used.

It is an advantage of using a magnetic sensor device having only a small number, for example only two sensing elements, in that this allows a highly compact design of the magnetic field sensor arrangement according to the invention.

Moreover, in some embodiments, the sensor-related, internal flux concentrator (also referred to as IMC) advantageously amplifies the second disturbance magnetic flux to be sensed in the second sensing direction (e.g. passively amplifies the magnetic component parallel to the semiconductor plane) which enters the air gap without receiving amplification by the first and second magnetic flux concentrators (in contrast to the signal magnetic flux and the first disturbance magnetic flux both being guided by the first and second magnetic flux concentrators in the first sensing direction).

The magnetic sensor device may comprise for example two sensing elements for measuring the magnetic field component in the first direction, and two other sensing elements for measuring the magnetic field component in the second direction. In a particular embodiment, the sensor device comprises four horizontal Hall elements (e.g. a first, second, third and fourth horizontal Hall element) arranged at the periphery of a circular IMC, spaced apart by 90°. The signals from the first and third element, located 180° apart, may be added to measure a first magnetic field component. The signals from the second and fourth element, located 180° apart, may be subtracted to measure a second magnetic field component. It is an advantage of using four sensors (rather than only two), in that they allow to independently tune or match the two pairs of horizontal Hall elements, in order to improve the accuracy.

Preferably, the magnetic field sensor comprising one sensing element or more sensing elements may be arranged within a single chip package, e.g. a plastic moulded package, although this is not absolutely required.

According to a third aspect, the present invention provides a magnetic torque sensor arrangement for stray-field-immune determining of a torque applied to a torque bar, comprising: an angle sensor arrangement according to the second aspect; said torque bar having a first axial end connected (directly or indirectly) to the first ring, and a second axial end connected (directly or indirectly) to the second ring, such that, when a torque is applied to the torque bar, the torque bar is elastically deformed, thereby causing an angular displacement of the first and second ring as a function of the applied torque; and wherein the magnetic field sensor is further configured for converting the signal magnetic flux or the angular displacement into a torque value.

This conversion can be achieved in manners known per se, for example using a mathematical expression, or a look-up table with optional interpolation.

It is to be noted that with regard to the effects and advantages of the features regarding the magnetic torque sensor arrangement disclosed herein, reference is made in its entirety to the corresponding, analogous features of the magnetic field sensor arrangement and/or the angle sensor arrangement disclosed herein as well as to their effects and advantages. Therefore, features of the magnetic field sensor arrangement and/or features of the angle sensor arrangement disclosed herein shall be regarded as features applicable for the definition of the magnetic torque sensor arrangement according to this invention as well, unless explicitly stated otherwise. Likewise, features of the magnetic torque sensor arrangement disclosed herein shall be regarded also as features applicable for the definition of the magnetic field sensor arrangement or the angle sensor arrangement according to this invention, unless explicitly stated otherwise. Hence, for the purposes of conciseness of this specification and for improved comprehensibility of the principles of the present invention, duplication of explanations of these analogous features, their effects and advantages is largely omitted hereinafter.

The present invention also provides a method for stray-field-immune determining a signal magnetic flux generated by a signal magnetic field source in a manner which is highly immune to a magnetic disturbance field, e.g. a homogeneous disturbance field, the method comprising the steps of: a)

providing a magnetic structure comprising a magnetic source and two magnetic concentrators configured for guiding a magnetic flux generated by said source, and forming an air gap oriented in a radial direction with respect to the magnetic structure; b) measuring, inside the air gap, a first magnetic field component signal oriented in the radial direction, indicative of a combination of a signal generated by the magnetic source and a first portion of a disturbance field oriented in the axial direction with respect to the magnetic structure; c) measuring, inside the air gap, a second magnetic field component signal oriented in an axial direction of the magnetic structure, indicative of a second portion of said disturbance field oriented in the axial direction with respect to the magnetic structure; d) reducing or eliminating the first disturbance portion by scaling the second signal with a predefined constant, and by subtracting the scaled signal from the first signal; e) optionally converting the corrected first signal into an angular distance value and/or into a torque value, e.g. using a mathematical expression or a look-up table.

A method comprising steps a) to e) is a method of measuring an angular distance and/or a method of measuring a torque value in a manner which is highly immune to a magnetic disturbance field.

The present invention also provides a method for stray-field-immune determining a signal magnetic flux generated by a signal magnetic field source in a manner which is highly immune to a magnetic disturbance field, in particular a homogenous disturbance field, using a magnetic arrangement according to the first aspect, the method comprising the steps of: a) receiving and guiding the signal magnetic flux and a first portion of the disturbance field by and within the first and second magnetic flux concentrator, into and across the air gap; b) measuring a first magnetic signal oriented in the first direction, indicative of said combination of the signal magnetic flux and said first portion of the disturbance flux; c) measuring a second magnetic signal oriented in the second direction perpendicular to the first direction, indicative of said second portion of the disturbance flux; d) determining said signal magnetic flux based on the first magnetic signal and the second magnetic signal.

In an embodiment, step d) comprises: scaling the second magnetic signal with a predefined constant, and subtracting this signal from the first magnetic signal, thereby reducing or substantially eliminating the influence of the first disturbance magnetic flux.

The present invention also provides a method for stray-field-immune determining a signal magnetic flux generated by a signal magnetic field source in a manner which is highly immune to a homogeneous disturbance field, the method comprising the steps of: a) receiving and guiding the signal magnetic flux and a first portion of the disturbance field by and within a first and a second magnetic flux concentrator into and across an air gap essentially in a gap direction, the air gap being formed between an exterior face of the first magnetic flux concentrator and an exterior face of the second magnetic flux concentrator, wherein both exterior faces are respective exterior faces of the first and second magnetic flux concentrators, respectively, having a minimum distance therebetween and defining the gap direction of the air gap by the line of shortest length therebetween; b) determining, by means of a magnetic field sensor arranged in the air gap and configured for being sensitive to a magnetic field in at least a first and a second sensing direction, wherein the first and second sensing directions are essentially perpendicular to each other, the signal magnetic flux and the first portion of the disturbance flux by its first sensing direction; c) determining, by means of the magnetic field sensor, a second portion of the disturbance flux crossing the air gap without being received by and guided within the first and second magnetic flux concentrators by its second sensing direction; d) reducing or substantially eliminating the amount of the first disturbance magnetic flux contained in the superposition of the signal magnetic flux and the first disturbance magnetic flux which is sensed in the first sensing direction essentially by scaling the amount of the second disturbance magnetic flux sensed in the second sensing direction, and by subtracting this scaled signal from the superposition of the signal magnetic flux and the first disturbance magnetic flux.

The scaling can be performed in the analog or digital domain. (typically called "amplification" in the analog domain, and "multiplication" in the digital domain). The scaling can be performed using a predefined scaling factor.

According to a fourth aspect, the present invention provides a method of determining a signal magnetic flux generated by a signal magnetic field source and optionally modulated by a magnetic structure in a manner which is substantially immune against a magnetic disturbance field, comprising the steps of: a) providing a magnetic field sensor arrangement according to the first aspect; b) measuring, by the magnetic field sensor, a first signal of a magnetic field component oriented in the first direction; c) measuring, by the magnetic field sensor, a second signal of a magnetic field component oriented in the a second direction perpendicular to the first direction; d) reducing or substantially eliminating an influence of a magnetic disturbance field, if present, based on the measured first magnetic field component and the measured second magnetic field component.

Again, it is to be noted that with regard to the effects and advantages of the features regarding the method disclosed herein, reference is made in its entirety to the corresponding, analogous features of the magnetic field sensor arrangement and/or the angle sensor arrangement and/or the magnetic torque sensor arrangement disclosed herein as well as to their effects and advantages. Therefore, features of the magnetic field sensor arrangement and/or the angle sensor arrangement and/or the magnetic torque sensor arrangement disclosed herein shall be regarded as features applicable for the definition of the method for determining a signal magnetic flux according to this invention as well, unless explicitly stated otherwise. Likewise, features of the method disclosed herein shall be regarded also as features applicable for the definition of the magnetic field sensor arrangement and magnetic torque sensor arrangement, respectively, according to this invention unless explicitly stated otherwise. Hence, for the purposes of conciseness of this specification and for improved comprehensibility of the principles of the present invention, duplication of explanations of these analogous features, their effects and advantages is largely omitted hereinafter.

In an embodiment, step d) comprises: scaling the second signal with a predefined constant, and subtracting the scaled signal from the first signal.

In an embodiment, step d) is carried out by a processor unit and a memory unit integrated in the magnetic field sensor.

In an embodiment, step a) comprises: a) providing an angle sensor arrangement according to the second aspect; and wherein the method further comprises the following step: e) converting the corrected first signal into an angular distance value.

This method is in fact a method of determining an angle in a manner which is highly insensitive to a magnetic disturbance field.

Step e) may comprise: using a mathematical expression or a look-up table.

In an embodiment, step a) comprises: a) providing a torque sensor arrangement according to the third aspect; and the method further comprises the following step: e) converting the corrected first signal into a torque value.

This method is in fact a method of determining a torque in a manner which is highly insensitive to a magnetic disturbance field.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 12 shows a flowchart of a method of determining a signal magnetic flux generated by a signal magnetic field source and optionally modulated by a magnetic structure, in a manner which is highly immune to a disturbance field, according to an embodiment of the present invention.

Figures 1A, 1B:
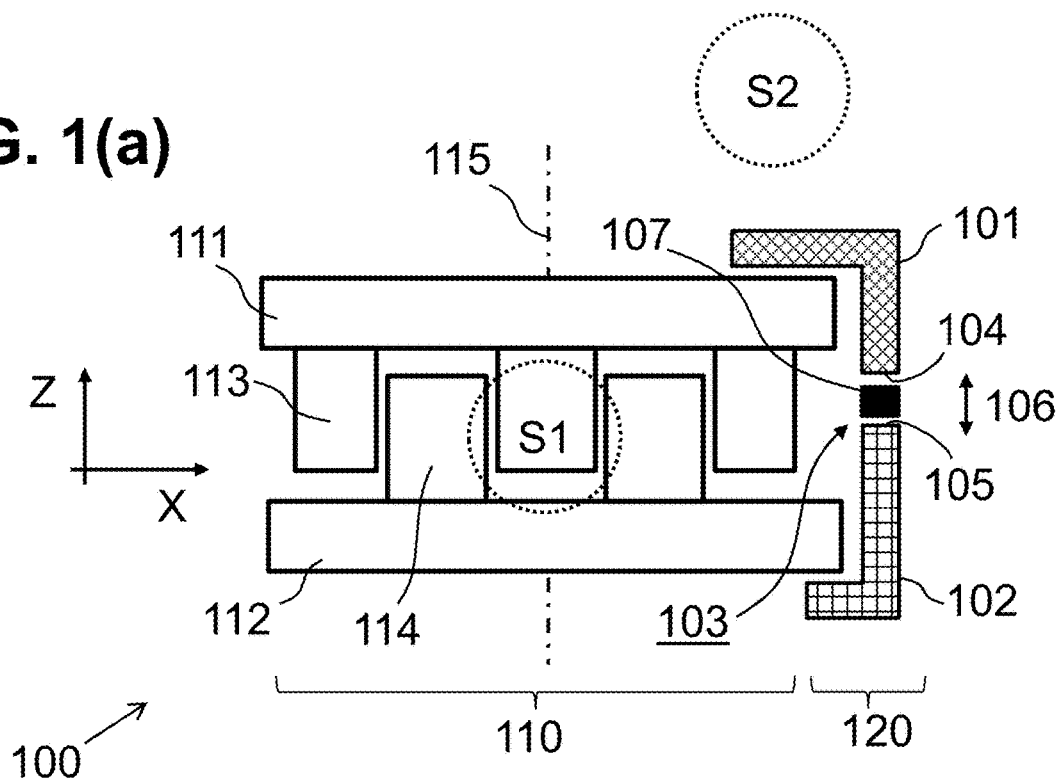
FIG. 1(a) and FIG. 1(b) illustrate a side view and a front view, respectively, of an embodiment of a magnetic field sensor arrangement known in the art.

The drawings are only schematic and are non-limiting. In the drawings, the size of some of the elements may be exaggerated and not drawn on scale for illustrative purposes. Any reference signs in the claims shall not be construed as limiting the scope. In the various drawings, equivalent elements with respect to their function are always provided with the same reference signs so that these elements are usually described only once.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the terms "magnetic disturbance field" and "magnetic stray field" are regarded to be synonymous terms. They will be used interchangeably herein and will refer essentially to the same subject-matter unless otherwise explicitly indicated.

In this document, the expression "strayfield immune" and "highly insensitive to an external disturbance field" and "highly robust against an external disturbance field" mean the same.

In this document, the expressions "for stray-field-immune determining" and "for determining in a manner which is substantially stray-field immune" mean the same.

In this document, the term "(external) magnetic field concentrator" or "flux guide" or "magnetic yoke" mean the same.

In this document, the terms "magnetic field sensor" and "magnetic sensor device" or "sensor device" mean the same. This magnetic sensor device comprises a semiconductor substrate with at least two magnetic sensor elements (e.g. Hall elements). This magnetic sensor device may be encapsulated in a moulded package, but that is not absolutely required.

Figure 2A:
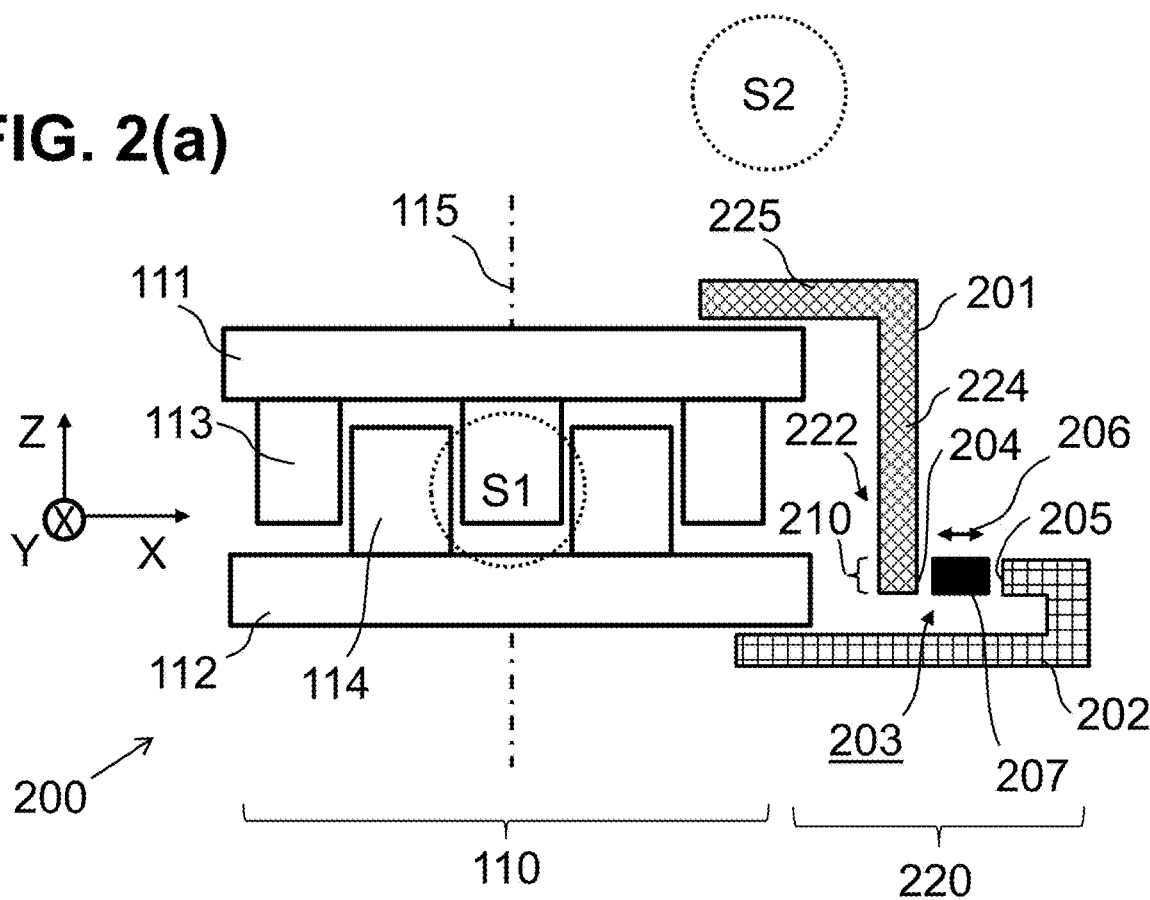
FIG. 2(a) and FIG. 2(b) illustrate a side view and a front view, respectively, of an exemplary embodiment of a magnetic field sensor arrangement and of an angle sensor arrangement according to the present invention.
Figure 2B:
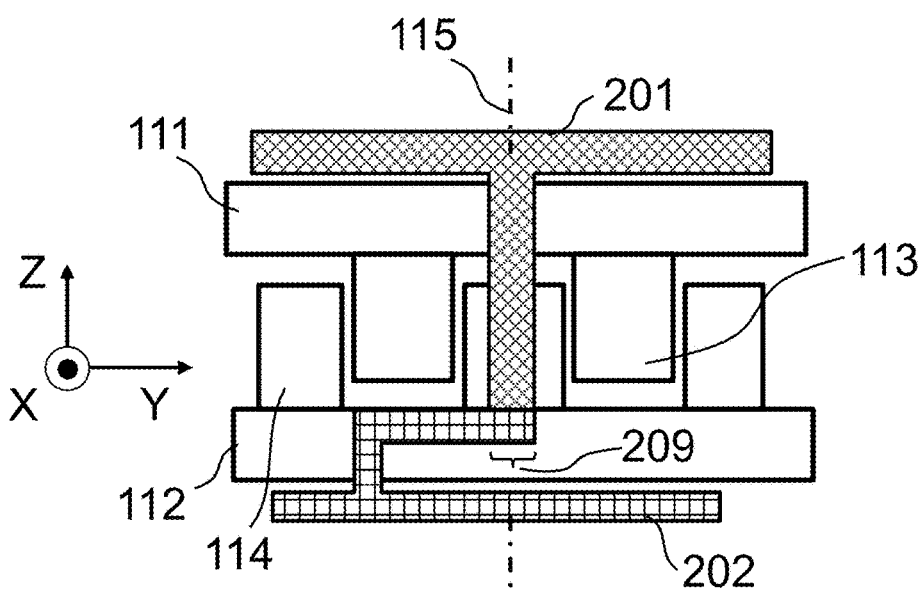

In this document, a first orthogonal coordinate system X,Y,Z can be connected to the magnetic field sensor arrangement, having an axial direction (denoted as Z), a radial direction (denoted as X) passing through the air gap, and a circumferential direction Y. (e.g. as depicted in FIG. 2(a) and FIG. 2(b)).

In this document, a second orthogonal coordinate system U,V,W can be connected to the semiconductor plane of the magnetic field sensor, where the U and V axes are parallel to the semiconductor plane, and the W axis is perpendicular to the semiconductor plane.

The expression "signal magnetic field" or "signal magnetic flux" as used herein refers to a (desired) signal or flux, respectively, originating from a "signal magnetic field source" (e.g. a multi-pole ring magnet) which is part of the magnetic arrangement. This signal and flux are used as a measurement signal, for example to contactlessly determine an angular displacement between two shaft portions, for example of a steering column or the like.

In this document, the term "signal magnetic field source" refers to a "magnetic source", e.g. one or more permanent magnets, part of the magnetic arrangement, for example, a radially magnetized multi-pole ring magnet.

In this document, the terms "magnetic field sensor arrangement" or "magnetic arrangement" or "magnetic structure" are used as synonyms.

In this document, unless explicitly mentioned otherwise, the term "magnetic field sensor" or "magnetic sensor device" refers to a device comprising at least two magnetic sensitive elements. The sensor device may be comprised in a package, also called "chip", although that is not absolutely required. In embodiments of the present invention, the magnetic sensor comprises a semiconductor substrate. The at least two magnetic sensitive elements may be integrated in said substrate.

In this document, the term "sensor element" or "magnetic sensor element" or "sensor" can refer to a component or a group of components or a sub-circuit or a structure capable of measuring a magnetic quantity, such as for example a magneto-resistive element, an XMR element, a horizontal Hall plate, a vertical Hall plate, a Wheatstone-bridge containing at least one (but preferably four) magneto-resistive elements, a structure comprising a disk shaped magnetic concentrator and two or four horizontal Hall elements arranged near the periphery of said disk, etc.

FIG. 1(a) and FIG. 1(b) illustrate a side view and a front view, respectively, of a torque sensor 100 comprising a magnetic structure 110, and a magnetic field sensor arrangement 120, known in the art. The sensor arrangement 120 is configured to determine a signal magnetic flux (not specifically indicated) generated by a signal magnetic field source S1, for example a radially magnetized multi-pole ring magnet (not explicitly shown). The sensor arrangement 120 can also be regarded as a "readout portion" of the torque sensor 100.

However, this torque sensor 100, or this sensor arrangement 120 in particular, is not immune to an external disturbance magnetic field or flux (not shown in FIG. 1(a) or 1(b), but see e.g. FIG. 6(a) to FIG. 8(b)) generated by an external disturbance magnetic field source S2, for example one or more nearby current conductors carrying currents, particularly strong currents like several 10 A or even more than 100 A. Even though, strictly speaking, such a current does not create a homogeneous field (i.e. constant in orientation and amplitude), in practice the magnetic disturbance field can be considered to be "substantially homogeneous" in a relatively small space at a sufficient distance from said conductor, e.g. at a distance of at least 10 cm, or at least 20 cm from said current conductor.

The prior art sensor arrangement 120 comprises a first 101 and a second 102 magnetic flux concentrator (also referred to as magnetic yokes or flux guides). An air gap 103 is formed between an exterior face 104 of the first magnetic flux concentrator 101 and an exterior face 105 of the second magnetic flux concentrator 102. There is a direct line of sight between the first exterior face 104 and the second exterior face 105. A "gap direction" 106 may be defined by the line of shortest length (or line of shortest distance) between both exterior faces 104, 105 of the first and second magnetic flux concentrators 101, 102. In the arrangement of FIG. 1(a) the "gap direction" is oriented in the Z-direction, i.e. in the axial direction of the magnetic structure 110. Furthermore, a magnetic field sensor 107 (schematically indicated by a black rectangle) is arranged in the air gap 103. The magnetic field sensor 107 of the sensor arrangement 120 shown in FIG. 1(a) is sensitive to a magnetic field component Bz in the Z direction, i.e. in the axial direction of the structure 110.

The torque sensor 100 of FIGS. 1(a) and 1(b), further comprises a magnetic structure or magnetic arrangement 110 which comprises the signal magnetic field source S1, for example a radially magnetized multi-pole ring magnet, generating the signal magnetic flux (not shown). The magnetic structure 110 is configured and arranged such that the signal magnetic flux is modulated as a function of a relative angular displacement between a first magnetic ring 111 and a second magnetic ring 112 surrounding the signal magnetic field source S1. As is depicted in FIGS. 1(a) and 1(b), both magnetic rings 111, 112 have respective tooth-shaped or fin-shaped protrusions 113, 114 (also referred to as "teeth" or "claws" or "pads") being arranged along a periphery of each magnetic ring 111, 112 with their free ends mutually being directed to each other in an opposing manner. The protrusions 113, 114 of the first and second rings 111, 112 extend substantially in the direction of a common rotation axis 115 of both rings 111, 112. The magnetic field source S1 is arranged on an axis 115, between a center of the first ring 111 and a center of the second ring 112.

Thus the components 111, 112, 113, 114, S1 illustrated without shading, are considered to be part of the "magnetic structure" 110, while the shaded components 101, 102 and the sensor 107 are considered to be part of the "(magnetic field) sensor arrangement" 120. The combination of this magnetic structure 110 and the sensor arrangement 120 as shown in FIG. 1(a) is known to be used as a magnetic torque sensor arrangement 100 for determining a torque being applied to a torque bar (not shown in FIGS. 1(a) and 1(b)) resiliently connecting (e.g. by means of a torsion bar) an end of a first shaft (also known as an input shaft) to an end of a second shaft (also known as an output shaft). Further details of various embodiments of such a combination are for example disclosed in the above-mentioned document DE 102 22 118 A1, or in EP3505894.

Further, the signal magnetic flux generated by the signal magnetic field source S1 of the magnetic torque sensor arrangement shown in FIGS. 1(a) and 1(b) is received by and guided within the first and second magnetic flux concentrators 101, 102 to the air gap 103 essentially in the gap direction 106 (=Z direction), where it is sensed by the magnetic field sensor 107.

Now, if there is a disturbance magnetic flux generated by a disturbance magnetic field source S2 essentially in the Z direction, this flux will be captured/received by and guided within the first and second flux concentrators 101, 102 as well, thus superimposing the and adding to the signal magnetic field within the two flux concentrators 101, 102. Consequently, as the magnetic field sensor 107 cannot distinguish between the signal magnetic flux and the disturbance magnetic flux being guided to the air gap 103, the torque sensor 100 including the sensor arrangement 120 shown in FIGS. 1(a) and 1(b) is not immune (or robust) to the (external) disturbance magnetic flux generated by the (external) disturbance magnetic field source S2.

FIG. 2(a) and FIG. 2(b) illustrate a side view and a front view, respectively, of an exemplary embodiment of a torque sensor arrangement 200, including the magnetic structure 110 of FIGS. 1(a) and 1(b), but a modified sensor arrangement 220. This torque sensor 200 in general, and the magnetic field sensor arrangement 220 in particular, are capable of determining a signal magnetic flux generated by a signal magnetic field source S1, for example a radially magnetized multi-pole ring magnet, and optionally modulated by the magnetic structure 110, in a strayfield-immune manner.

In FIGS. 2(a) and 2(b), the magnetic field sensor arrangement 220 is also shown in combination with a magnetic structure 110 (or magnetic arrangement 110) as depicted in FIGS. 1(a) and 1(b). Thus, the combination of the magnetic field sensor arrangement 220 and the magnetic arrangement 110 may form a magnetic torque sensor arrangement 200 for stray-field-immune determining a torque being applied to a torque bar (not shown).

As shown in FIGS. 2(a) and 2(b), the magnetic field sensor arrangement 220 comprises a first 201 and a second 202 magnetic flux concentrator (also referred to as flux guide, or magnetic yoke). The flux concentrators 201, 202 are configured and arranged such that an air gap 203 is formed between an exterior face 204 of the first magnetic flux concentrator 201 and an exterior face 205 of the second magnetic flux concentrator 202. Both exterior faces 204, 205 are respective exterior faces of the first and second magnetic flux concentrators 201, 202, respectively, having a minimum distance therebetween and defining a "gap direction" 206 of the air gap 203 by the line of shortest length (or shortest distance) between the first and second exterior face 204, 205. A magnetic field sensor (or sensor device) 207, indicated by a black rectangle, is configured to be sensitive to a magnetic field in at least a first sensing direction X and a second sensing direction Z, wherein the first and second sensing directions X, Z are essentially perpendicular to each other.

More specifically, the X-direction is oriented substantially radially with respect to the magnetic structure 110, (thus perpendicular to the axis 115 and preferably intersecting the axis 115), and the Z-direction is substantially parallel to the axis 115 (thus parallel to the torsion bar, if present). In other words, the X-direction is substantially located in an imaginary plane X-Y perpendicular to said axis 115.

Figure 6A:
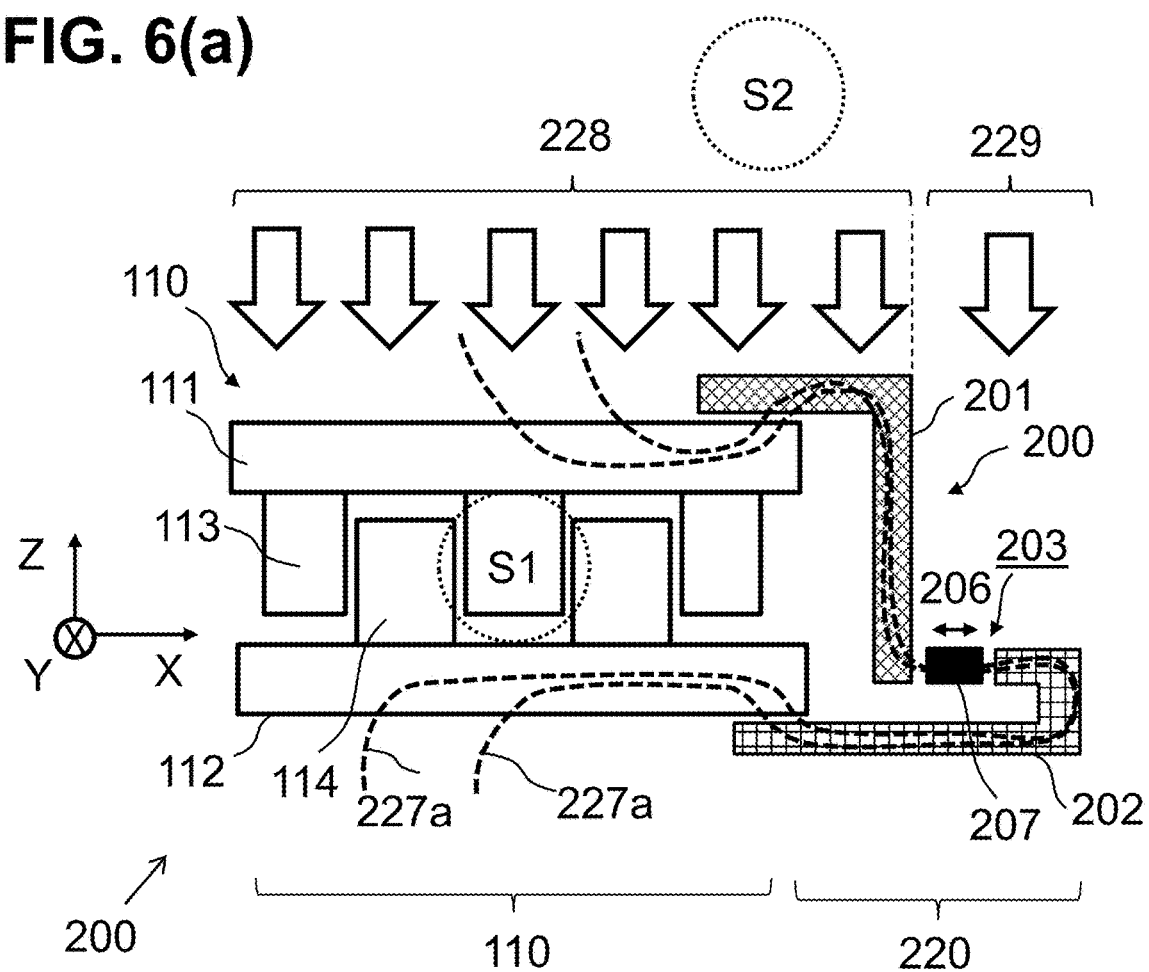
FIG. 6(a) and FIG. 6(b) illustrate a side view and a front view, respectively, of the magnetic field sensor arrangement shown in FIGS. 2(a) and 2(b) depicting the course of a first portion of magnetic flux lines generated by an external disturbance magnetic field source (located at the top of FIG. 6(a)). This first portion passes the air gap in the gap direction (radially with respect to the magnetic structure).

Furthermore, the first and second magnetic flux concentrators 201, 202 are further configured and arranged such that the signal magnetic flux generated by the signal magnetic field source S1 and a first portion 228 of a disturbance magnetic flux (see FIG. 6(a)) generated by a disturbance magnetic field source S2 which is different from the signal magnetic field source S1, will be received by and guided within the first and second magnetic flux concentrators 201, 202 into and across the air gap 203 essentially in the gap direction 206, thus in the radial direction X. A second portion 229 of the disturbance magnetic flux (see FIG. 6(a))

generated by the disturbance magnetic field source S2 will cross the air gap 203 without being received by and guided within the first and second magnetic flux concentrators 201, 202 to the air gap 203. This is an important aspect of the present invention, which will be explained in more detail further.

As mentioned above, if the torque sensor 200 is located sufficiently far from the external disturbance source S2, e.g. at a distance of at least 10 cm, or at least 20 cm, or at least 30 cm, the external disturbance field can be considered to be substantially homogeneous, in particular "inside the air gap". The magnetic field sensor 207 is arranged in the air gap 203 such that it is able to sense the combination of the signal magnetic flux and the first portion of the disturbance magnetic flux passing the air gap in the first direction X, and the second portion of the disturbance magnetic flux passing the air gap in the second direction Z. Depending on the orientation of the sensor device, the X and Z direction can be parallel or orthogonal to the semiconductor substrate, as will be described further (in FIG. 3(a) to FIG. 4(b)).

The "air gap space" may be defined as the 3D space between the above mentioned first and second exterior face 204, 205, more specifically, between corresponding points of these faces for which the distance is substantially equal to said "minimal distance" within a small tolerance margin (e.g. +/−10% or +/−5%). In the example of FIGS. 2(a) and 2(b), this 3D space has a length 206 (in the X direction) equal to the "gap length", and has a cross sectional area (in the Y-Z plane) defined by the shape of the first exterior face 204 and the second exterior face 205, for example by an overlap of a projection of these exterior faces on the Y-Z plane in the gap direction. In the example of FIGS. 2(a) and 2(b), this overlap is substantially rectangular, having a width 209 (see FIG. 2(b)) and a height 210 (see FIG. 2(a)). Thus, in the example of FIGS. 2(a) and 2(b), the "air gap space" or "space of the air gap" is substantially beam-shaped but may also be substantially cubical.

Preferably, the sensor device 207 is arranged substantially inside the air gap 203, in the sense that all magnetic sensitive elements (e.g. Hall elements and/or IMC) of the magnetic sensor 207 are located inside this air gap space.

Figure 3A:
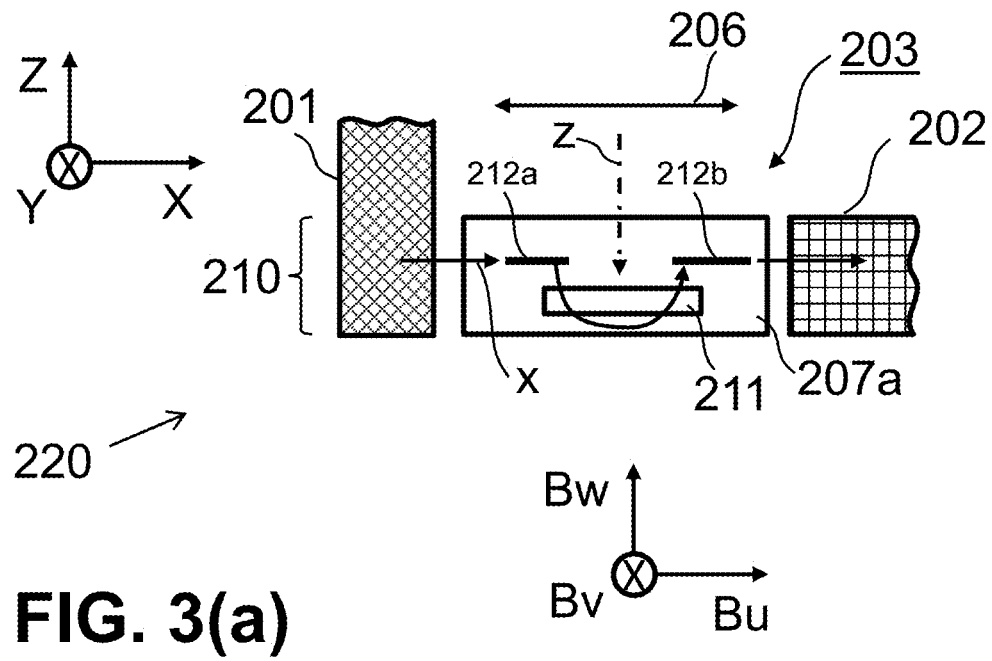
FIG. 3(a) and FIG. 3(b) and FIG. 3(c) show enlarged views of embodiments of the present invention, illustrating a portion of the magnetic field sensor arrangement illustrated in FIG. 2(a). The sensor device of FIG. 3(a) is oriented horizontally and contains two horizontal Hall elements and an integrated magnetic concentrator (IMC). The sensor device of FIG. 3(b) is oriented vertically and contains two horizontal Hall elements and IMC. The sensor device of FIG. 3(c) is oriented vertically and contains a horizontal Hall element and a vertical Hall element.
Figure 3B:
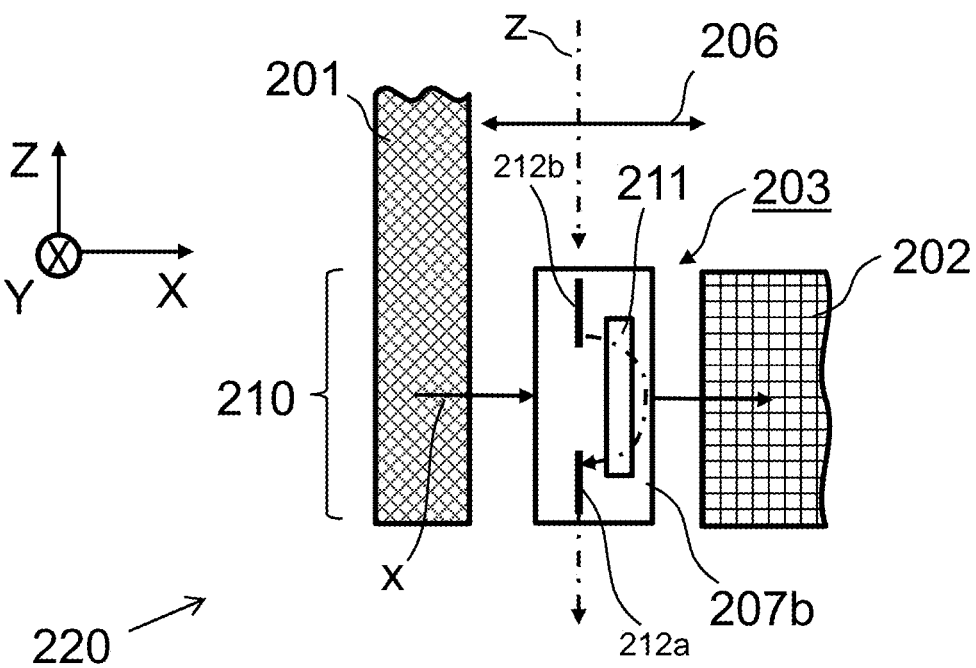

FIGS. 3(a) and 3(b) show enlarged views of two embodiments of a portion of the magnetic field sensor arrangement 220 illustrated in FIGS. 2(a) and 2(b), in particular the portion near the air gap 203.

In the embodiment of FIG. 3(a), the semiconductor substrate of the magnetic sensor device 207a is oriented substantially parallel to the X-Y plane, i.e. parallel to the gap direction 206, and perpendicular to the axial direction Z.

Assuming that a second coordinate system with axes U,V,W is connected to the sensor device 207a such that the semiconductor substrate is parallel to the UV-plane and orthogonal to the W-axis, the U-axis of the sensor device corresponds to the X-axis of the magnetic structure, the V-axis of the sensor device corresponds to the Y-axis of the magnetic structure, and the W-axis of the device corresponds to the Z-axis of the structure. Thus, stating that the sensor device needs to be sensitive in the X and Z direction relative to the magnetic structure, is equivalent to stating that the sensor device 207a needs to be sensitive in the U and W direction.

The sensor device 207a depicted in FIG. 3(a) contains an integrated magnetic concentrator (IMC) 211 and two horizontal Hall elements 212a, 212b arranged near a periphery of the IMC. Such a sensor structure is known in the art, and is capable of measuring both a (so called "out of plane") magnetic field component Bw oriented perpendicular to the semiconductor substrate, and a (so called "in-plane") magnetic field component Bu oriented parallel to the semiconductor substrate. The reader not familiar with such a sensor structure can find more information for example in patent publication US2018372475(A1) (see e.g. FIG. 4(a) to FIG. 4(c)), or in patent application EP3505894A1, filed by the same applicant on Dec. 12, 2018, in particular FIG. 6 and FIG. 7(a,b,c), both documents incorporated herein by reference in their entirety. It is noted however that other suitable sensor devices capable of measuring two orthogonal magnetic field components can also be used. The sensor device 207 needs to be oriented such that the sensor device is capable of measuring two orthogonal magnetic field components, one oriented in the gap-direction 206 (corresponding to the X-direction of the magnetic structure), and one perpendicular to the gap-direction (corresponding to the Z-direction of the magnetic structure).

Referring back to FIG. 3(a) of the present invention, the sensor device 207a is oriented such that its semiconductor substrate is perpendicular to the Z-axis. The sensor device 207a contains an integrated magnetic concentrator (IMC) 211, e.g. a disk-shaped IMC, and two horizontal Hall elements 212a, 212b located near the periphery of the IMC. The sensor device 207a is capable of measuring an out-of-plane magnetic field component Bw (oriented in the Z-direction of the magnetic structure) and an in-plane magnetic field component Bu (oriented in the X-direction of the magnetic structure).

The Bw signal can e.g. be determined by adding the signals obtained from the two Hall elements 212a, 212b. The Bu signal can e.g. be determined by subtracting the signals from the two Hall elements. In this orientation of the sensor device 207a, the Bu signal is indicative of the superposition of the signal magnetic flux and the first portion 228 of the disturbance magnetic flux (see FIG. 6(a)), if present, and the Bw signal is indicative only of the second portion 229 of the disturbance magnetic flux. In this orientation of the sensor device 207a, the Bu signal is passively amplified by the presence of the integrated magnetic concentrator 211. This orientation is not ideal however, because (i) the width of the substrate is typically larger than its thickness, hence the gap distance needs to be relatively large in order to fit the sensor device 207a, (ii) the second portion 229 of the disturbance flux is typically very weak, but is not amplified by a magnetic flux concentrator.

Referring to FIG. 3(b), the sensor device 207b may be exactly the same sensor device as the sensor device 207a of FIG. 3(a) but rotated by 90° about the Y-axis. The sensor device 207b is capable of measuring an out-of-plane magnetic field component Bw oriented in the X-direction of the magnetic structure, and an in-plane magnetic field component Bu oriented in the −Z direction of the magnetic structure. In this orientation of the sensor device 207b, the Bw signal is indicative of the superposition of the signal magnetic flux and the first disturbance portion 228 (not amplified by the IMC); and the Bu signal is indicative of the second disturbance portion 229 and is passively amplified by the IMC.

It is an advantage of this embodiment that the gap distance 206 of FIG. 3(b) can be smaller than the gap distance 206 of FIG. 3(a). This is true not only for a packaged sensor device, but also for an unpackaged sensor device, because the substrate thickness is typically much smaller than the width of the substrate. Moreover, it is possible to further reduce the semiconductor substrate thickness by a process known as "wafer thinning". In this case, a substrate with a thickness smaller than 500 µm, or smaller than 400 µm, or smaller than 300 µm may be used. Using a smaller gap distance 206 has a positive influence on the magnetic flux density, and thus on the Signal-to-Noise Ratio, and thus on the accuracy of the signal. It is a further advantage that the (weak) second disturbance portion 229 is passively amplified by the IMC.

Or stated in other words, a particular advantage of this "vertical arrangement" of the magnetic field sensor 207b with respect to the "horizontal arrangement" shown in FIG. 3(a) is that the magnetic gain provided by the internal flux concentrator 211 can be utilized to amplify the (disturbance) magnetic flux Bz entering the air gap 203 in the Z direction, in contrast to the magnetic flux Bx entering the air gap 203 in X direction, which is (already) amplified (externally) by the two magnetic flux concentrators (or yokes) 201, 202.

But the present invention is not limited to the examples shown in FIG. 3(a) and FIG. 3(b), and other sensor devices can also be used, for example sensor devices comprising magneto-resistive elements.

Figure 3C:
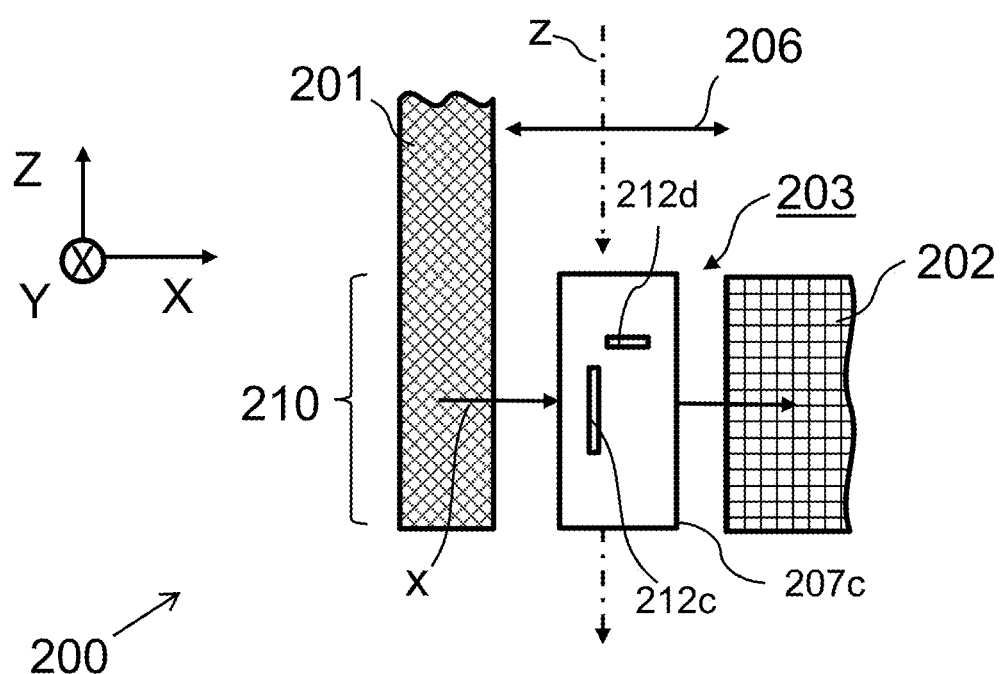

FIG. 3(c) shows a variant of the sensor arrangement of FIG. 3(b). The sensor device 207c of FIG. 3(c) is also oriented "vertically" (i.e. with its semiconductor substrate parallel to the Y-Z plane) but contains a horizontal Hall element 212c and a vertical Hall element 212d. The horizontal Hall element 212c is configured for measuring a first magnetic field component in the W-direction relative to the substrate corresponding to the radial direction of the magnetic structure, and a second magnetic field component in the U-direction corresponding to the axial direction of the magnetic structure.

This embodiment has the advantage of not requiring IMC, and of the small gap distance, but does not provide passive amplification of the second disturbance field portion 229 (not shown, but passing the air gap in the axial direction Z).

Figure 4A:
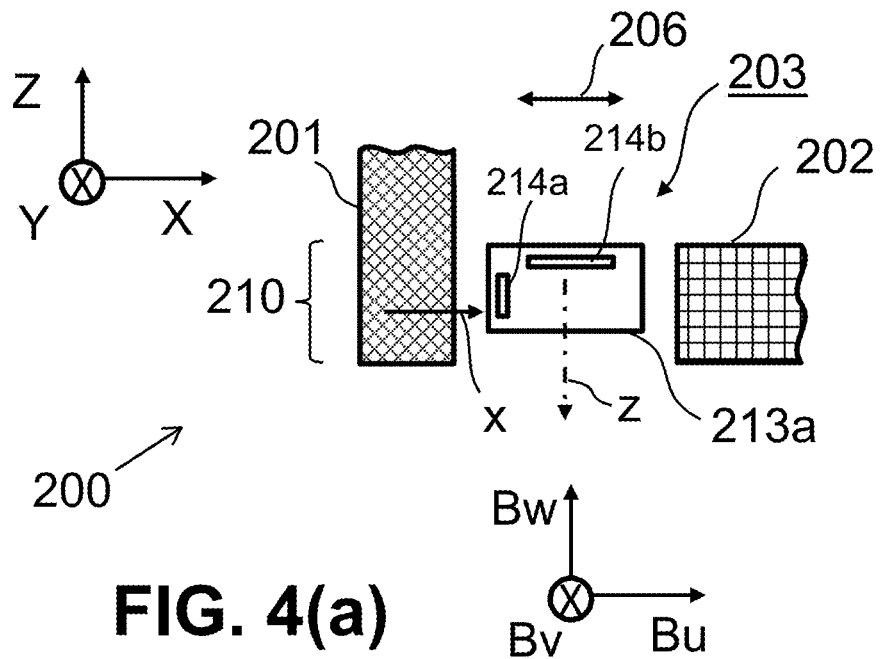
FIG. 4(a) and FIG. 4(b) show a similar view as FIG. 3(a) to FIG. 3(c), but of other exemplary embodiment of a magnetic field sensor arrangement according to the invention. The sensor device of FIG. 4(a) is oriented horizontally and contains a horizontal Hall element and a vertical Hall element. The sensor device of FIG. 4(b) is oriented vertically and contains two vertical Hall elements.
Figure 4B:
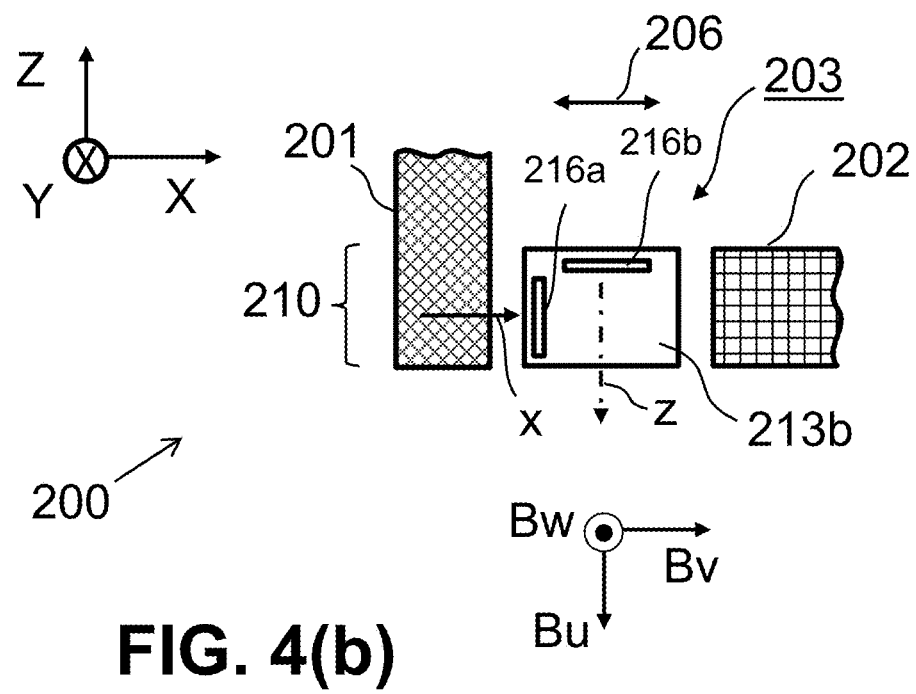

FIG. 4(a) and FIG. 4(b) show a similar view as FIGS. 3(a) to 3(c), but of other exemplary embodiments of a magnetic field sensor arrangement (not shown as a whole) according to the present invention. In these embodiments, the magnetic field sensor 213a, 213b comprises at least one sensing element 214, such as for example a magneto-resistive element, an XMR element, a vertical Hall plate, a Wheatstone-bridge containing at least one magneto-resistive elements, etc., for each of the at least two sensing directions X, Z (relative to the magnetic arrangement) or U, V (relative to the semiconductor substrate), the magnetic field sensor 213, 213b is sensitive to. The sensor devices 213 of FIGS. 4(a) and 4(b) do not contain integrated magnetic field concentrators (IMC).

More specifically, in the embodiment of FIG. 4(a), the semiconductor substrate is oriented "horizontally" (i.e. the substrate is parallel to the X-Y plane, and the substrate thickness is in the Z-direction), and sensor element 214a is a vertical Hall element configured for measuring Bx, and sensor element 214b is a horizontal Hall element configured for measuring Bz.

In the embodiment of FIG. 4(b), the semiconductor substrate is oriented "vertically" (the substrate is parallel to the X-Z plane, the substrate thickness is in the Y-direction), sensor element 216a is a vertical Hall element configured for measuring the signal Bx (containing the combination of the desired signal and the first disturbance portion 228), and sensor element 216b is a vertical Hall element configured for measuring the signal Bz (containing only the second disturbance portion 229).

In some embodiments of the present invention, wherein at least two sensor elements are used in the magnetic field sensor, the sensor elements may have different sensitivities to magnetic fields to be detected. Different sensitivities can for example be achieved by the use of different sensor technologies as mentioned above, and/or different sensor configurations (for example with/without an internal magnetic flux concentrator), by using different biasing means (e.g. voltage or current), by using a different electronic gain, etc.

It is to be noted that the magnetic field sensors 207, 213 shown in FIGS. 3(a) to 3(c) and FIGS. 4(a) and 4(b), respectively, may each be provided as a single semiconductor substrate, optionally encapsulated in a single chip package. Although not shown, this substrate and/or this chip package may also include a processor unit, e.g. a microprocessor or microcontroller, and a memory unit, e.g. volatile and/or non-volatile memory such as RAM, ROM, Flash and the like, as described herein. This processor, memory etc. do not need to be located inside the air gap, but it is important that the magnetic sensitive elements are located inside the air gap.

In preferred embodiments of the present invention, the sensor device is configured for determining the flux generated by the first magnetic field source S1 and modulated by the magnetic structure 110, by performing the following steps:

a) measuring a first magnetic field component Bx oriented in the gap direction (radial direction of the magnetic structure 110);

b) measuring a second magnetic field component Bz oriented in a direction perpendicular to the gap direction (the axial direction of the magnetic structure 110);

c) multiplying the second signal by a predefined constant K to obtain an estimate of the first disturbance portion 228. The value of K may be hardcoded, or stored in a non-volatile memory;

d) subtracting the first signal and said estimate of the first disturbance portion, thereby reducing or substantially eliminating the influence of the external disturbance field, which is considered to be substantially homogeneous, at least inside the air gap.

Depending on the application, e.g. an angle sensor, or a torque sensor application, the method may comprise a further step e) of demodulating the result of the subtraction, e.g. using a lookup-table, optionally with linear interpolation.

Figure 5A:
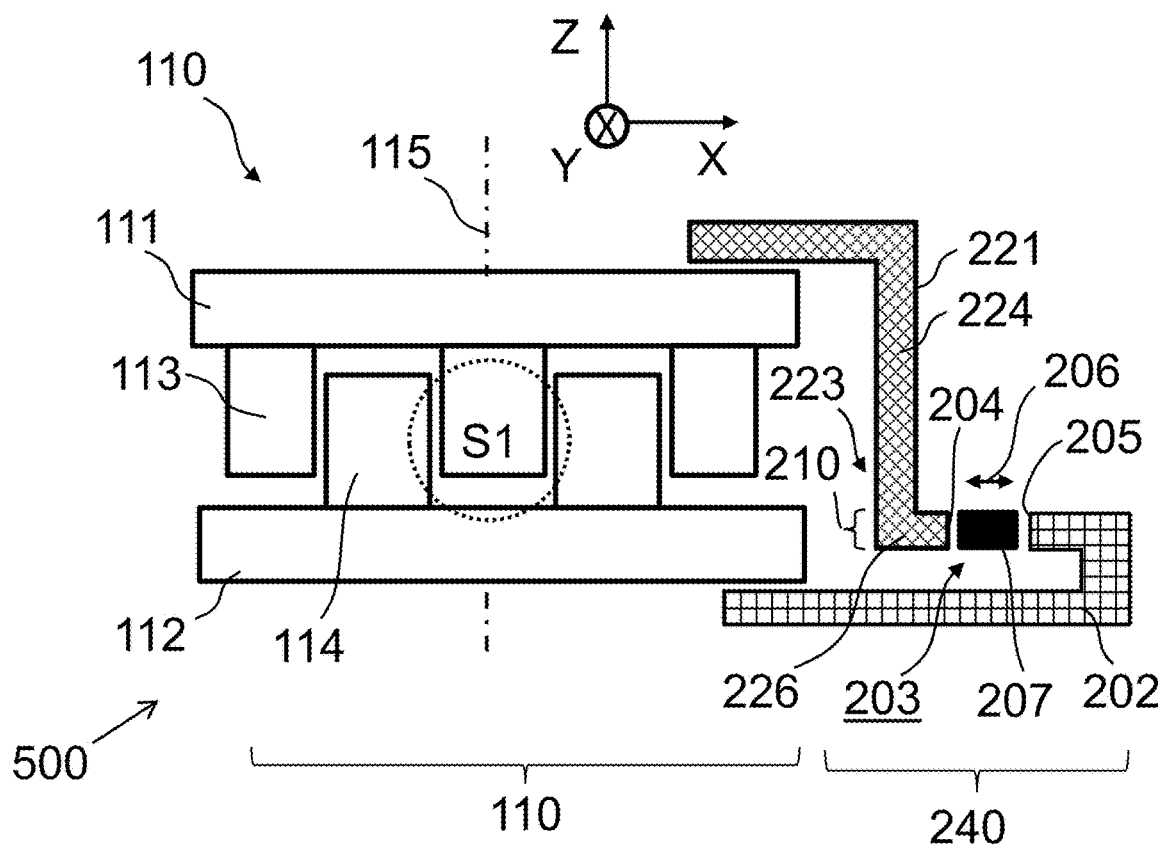
FIG. 5(a) and FIG. 5(b) illustrate a side view of another exemplary embodiment of a magnetic field sensor arrangement according to the present invention, which can be seen as a variant of the magnetic field sensor arrangement of FIGS. 2(a) and 2(b), where one of the magnetic yokes has a protruding portion for defining the air gap. The sensor device is represented by a black rectangle. Any of the sensor devices of FIG. 3(a) to FIG. 4(b) can be used.

FIG. 5(a) illustrates a side view of another exemplary embodiment of an angle sensor or a torque sensor 500, comprising a magnetic field sensor arrangement 240 according to the present invention. Compared to the magnetic field sensor arrangement 220 shown in FIGS. 2(a) and 2(b), the magnetic field sensor arrangement 240 of FIGS. 5(a) and 5(b) comprises a first magnetic flux concentrator 221 having a slightly different configuration in the vicinity of the air gap 203 as will be described next.

In FIGS. 2(a) and 2(b), this exterior face 204 is a region located on a side surface of a vertically oriented leg portion 224 of the first flux concentrator 221, where the flux lines (not shown) cross the air gap, which in practice means at a location where the distance to an exterior surface 205 of the second magnetic flux concentrator 202 is minimal. In this case, the exterior face region 204 is not explicitly delimited.

In FIG. 5(a), the exterior face 204 of the first magnetic flux concentrator 221 is also provided on a section 223 of the first magnetic flux concentrator 221, at a location where the field lines will leave the first magnetic concentrator 201, which in practice means at a location where the distance to an exterior surface 205 of the second magnetic flux concentrator 202 is minimal, but in this case, the boundary of this exterior face 204 is precisely delimited by means of a protrusion 226 or a bend 226 or the like, extending radially outwards with respect to the first magnetic flux concentrator 221.

As can be seen, the first magnetic concentrator 221 of FIG. 5(a) has a Z-shape (in a cross-sectional plane parallel to the X-Z plane). More specifically, the first flux concentrator 221 (or yoke) has a protrusion or a bent portion directed toward the air gap 203. As a consequence, the exterior face 204 is clearly defined, and is located at the end of this protrusion or bent portion.

Figure 5B:
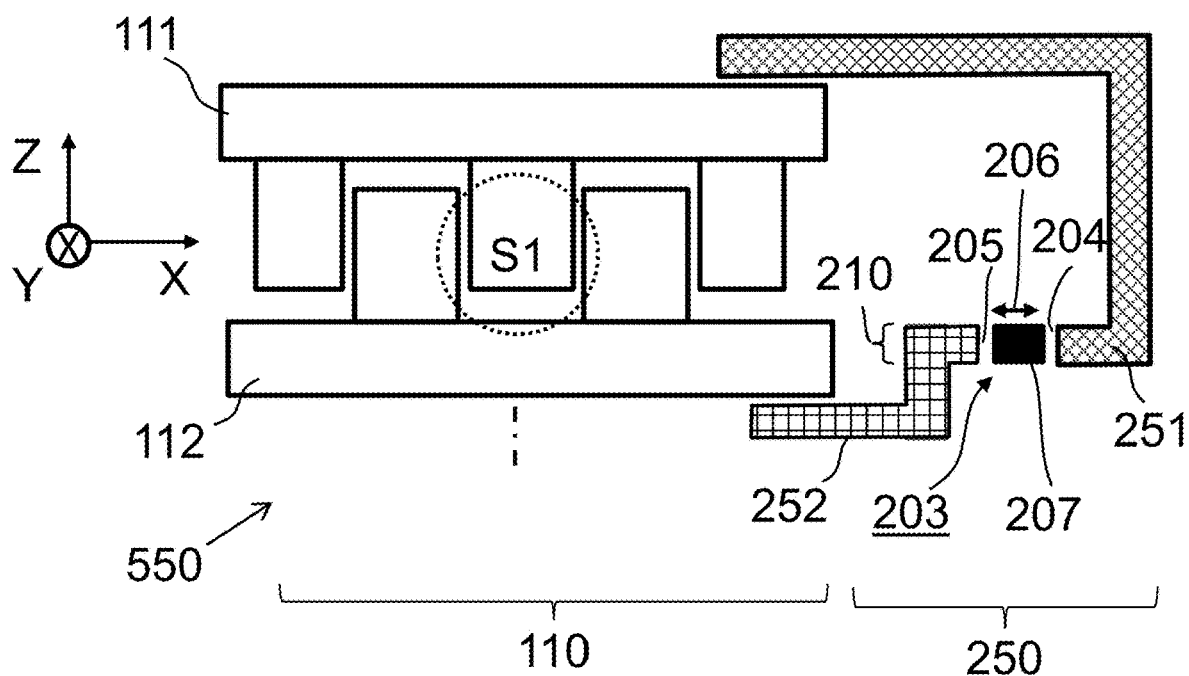

FIG. 5(b) shows another angle sensor or torque sensor 550, as a variant of the angle sensor or torque sensor 500 of FIG. 5(a). The magnetic structure 110 is identical to that of FIGS. 2(a) and 2(b) and FIG. 5(a), but the sensor arrangement 250 is slightly different. In this case, the first magnetic yoke 251 arranged adjacent the first ring 111 extends further outward in radial direction than the second magnetic yoke 252. Importantly, however, also in this case, the gap direction 206 is oriented in a radial direction X relative to the magnetic structure 110, between a first face 204 on the first magnetic concentrator 251 and a second face 205 on the second magnetic concentrator 252.

The skilled person having the benefit of the present disclosure will understand that FIG. 5(a) and FIG. 5(b) are two examples in which the air gap 203 is located substantially at the same axial position as the lower ring 112, but of course, the present invention is not limited thereto, and the air gap 203 can also be situated at a different axial position, for example substantially halfway between the first and second ring 111, 112, which can be achieved by decreasing the length of the vertical (axial) leg 224 of the first concentrator 201, 221, 251, and by increasing the vertical (axial) leg of the second concentrator 202, 252, such that the gap direction 206 of the air gap 203 between them is oriented in a radial direction X.

While not explicitly shown, of course the same is true for FIGS. 2(a) and 2(b). Also here the location of the air gap 203 can be shifted in the axial direction, by making the vertical leg 224 (extending in the Z direction) shorter, and by making the vertical leg of 202 (extending in the Z-direction) longer.

Furthermore, while not explicitly shown in FIG. 5(a) and FIG. 5(b), the sensor device 207 can be arranged inside the air gap in a similar manner as shown in any of FIG. 3(a) to FIG. 4(b).

Figure 6B:
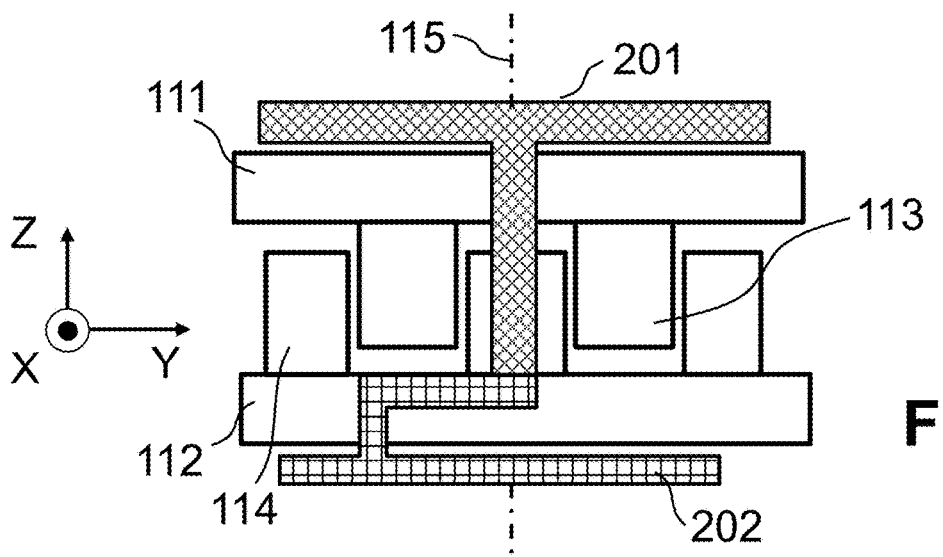

FIG. 6(a) and FIG. 6(b) illustrate a side view and a front view, respectively, of the angle sensor arrangement or the magnetic torque sensor arrangement 200 and of the magnetic field sensor arrangement 220 shown in FIGS. 2(a) and 2(b), furthermore depicting the course of magnetic flux lines 227a caused by a first portion 228 of a magnetic field generated by an external disturbance magnetic field source S2, and oriented in the Z direction at the location of the torque sensor arrangement.

As shown, the first portion 228 of the external magnetic disturbance field generated by the disturbance magnetic field source S2 is received by and guided within the first and second magnetic flux concentrators 201, 202 into and across the air gap 203 essentially in the gap direction 206, where it is sensed by the magnetic field sensor 207 by one or more sensor elements sensitive in the X-direction. In fact, the signal that is sensed in the X-direction is not only the first disturbance portion 228, but the superposition of this (unwanted) first disturbance portion 228 and the (wanted) signal magnetic flux, which is generated by the signal magnetic field source S1, for example by a radially oriented multi-pole ring magnet located substantially halfway between the first and second ring 111, 112 and optionally modulated by the magnetic structure 110. The sensor device 207 cannot distinguish the (wanted) signal magnetic flux, and the (unwanted) disturbance flux, based on the signal measured in the X-direction alone.

Figure 7A:
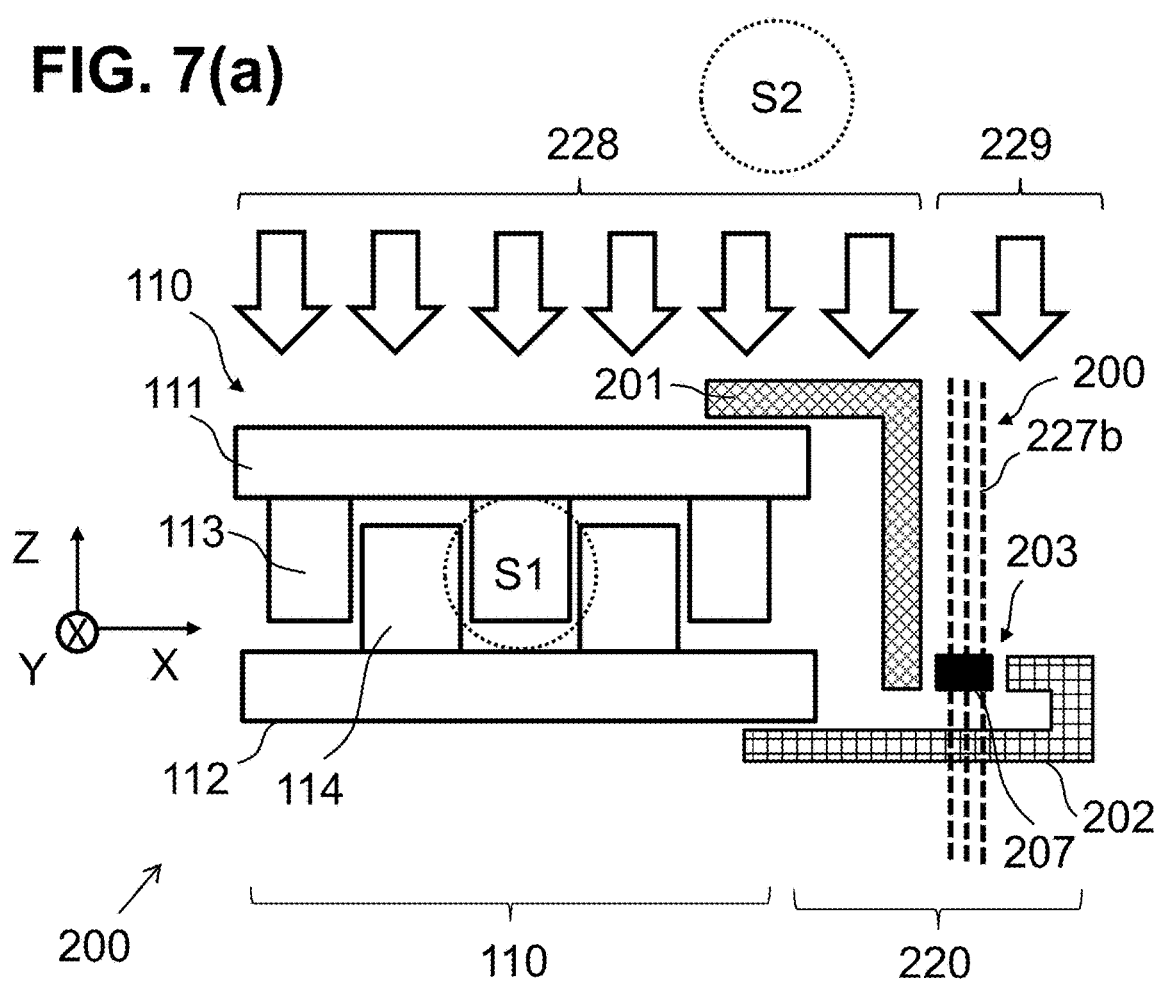
FIG. 7(a) and FIG. 7(b) show the same arrangement as FIGS. 6(a) and 6(b), but now showing the course of a second portion of the magnetic flux lines generated by the disturbance magnetic field source. This second portion passes the air gap in a direction perpendicular to the gap direction.
Figure 7B:
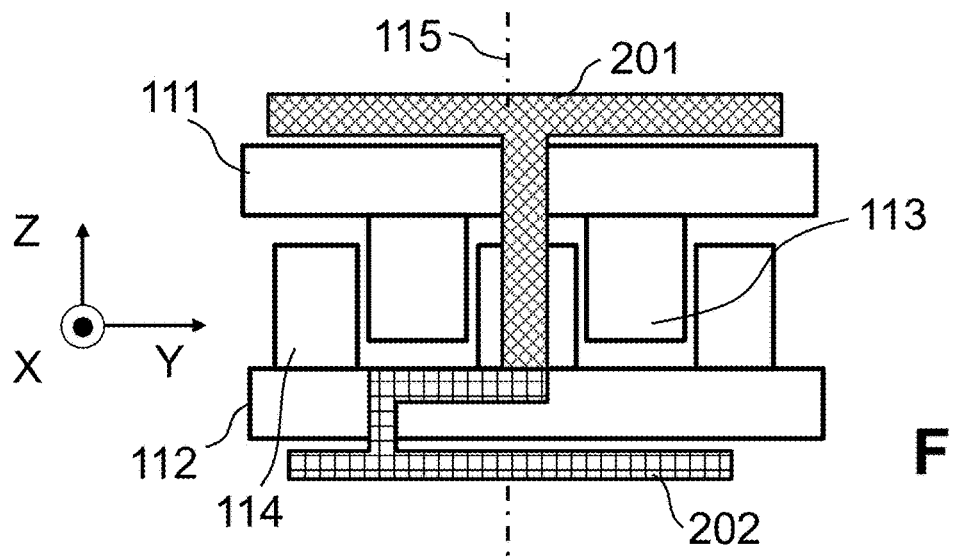

FIG. 7(a) and FIG. 7(b) illustrate a side view and a front view, respectively, of the magnetic torque sensor arrangement 200 and of the magnetic field sensor arrangement 220 shown in FIGS. 2(a) and 2(b), furthermore depicting the course of magnetic flux lines 227b caused by a second portion 229 of the magnetic field generated by the external disturbance magnetic field source S2, oriented in the Z direction at the location of the torque sensor arrangement.

The second portion 229 is not received by and guided within the first and second magnetic flux concentrators 201, 202 into the air gap 203. Instead, the second disturbance magnetic flux 229 crosses the air gap 203 in the Z direction (i.e. the axial direction of the magnetic structure) which is perpendicular to the X direction. The second disturbance magnetic flux 229 is sensed by the magnetic field sensor 207 by one or more sensor elements sensitive in the Z-direction. In this way, the amount of the external disturbance magnetic flux 229 present in the vicinity of the magnetic structure 200 and the field sensor arrangement 220 can be determined (e.g. measured) independently from the external disturbance magnetic flux 228 flowing within the first and second magnetic flux concentrators 201 and 202. Since the first and the second portion 228 and 229 come from the same source S2, their magnitudes are correlated. This correlation can be approximated by a predefined factor. This predefined factor is independent of the magnitude of the external disturbance field, but is mainly related to the shape and dimensions and materials of the magnetic arrangement 200, including the magnetic structure 110 and the magnetic sensor arrangement 220, and can be determined by design, by simulation, by calibration, or in any other suitable way. The predefined factor may be hardcoded in the program executed by the microcontroller or stored in non-volatile memory of the sensor device.

Thus, the overall magnetic flux sensed by the magnetic sensor 207 in the X direction (being the superposition of the wanted signal and the first disturbance portion) can be corrected through simple arithmetic operations, more specifically by scaling the magnetic signal Bz sensed by the magnetic field sensor 207 in the Z-direction with a predefined factor, and by subtracting the scaled signal from the magnetic signal Bx sensed by the magnetic field sensor 207 in the X-direction. It is noted that the scaling factor actually used, can also take into account a sensitivity difference in the X and Z direction of the sensor device (for example due to IMC amplification), and/or amplification factor caused by the first and second magnetic flux concentrators 201, 202. Thus, the disturbance field can be reduced or substantially eliminated in a surprisingly simple manner.

Further, it is noted that the disturbance magnetic fluxes 228, 229 generated by the external disturbance magnetic field source S2 may originate from a uniform or homogeneous disturbance magnetic field or from a non-homogeneous field source (e.g. a current conducting wire), located at a sufficient distance from the magnetic sensor arrangement, e.g. at least 10 cm or at least 20 cm.

In FIGS. 6(a) and 6(b) and FIGS. 7(a) and 7(b) the influence from an external disturbance field oriented in the Z-direction was described. As explained, this can be largely reduced or completely eliminated.

While not explicitly shown, it can be understood that an external disturbance field oriented in the Y-direction has no influence on the measurement, because a first portion of the disturbance field, which is received in the Y-direction by the first and second flux concentrator will also leave the first and second flux concentrator in the Y-direction without passing through the air gap, and because the sensor device itself is insensitive to a magnetic field passing the air gap in the Y-direction.

Figure 8A:
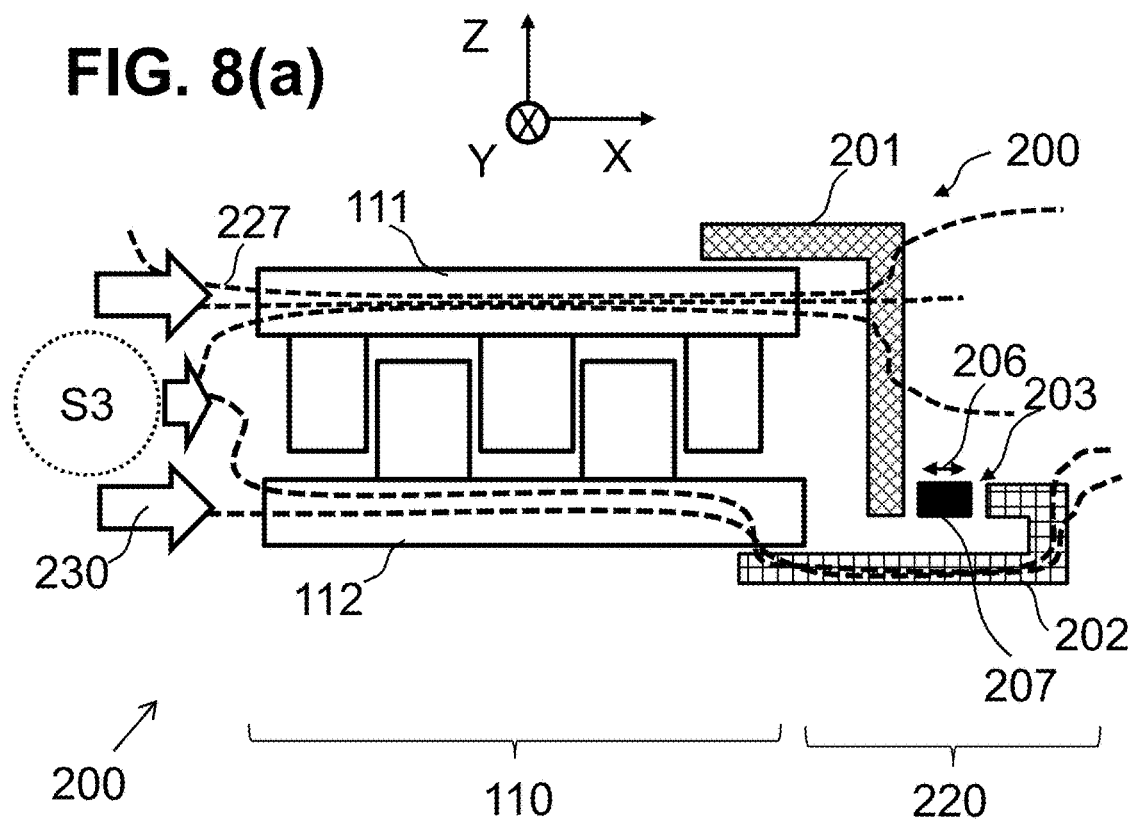
FIG. 8(a) and FIG. 8(b) illustrate a side view and a front view, respectively, of the magnetic field sensor arrangement shown in FIGS. 2(a) and 2(b) depicting the course of magnetic flux lines generated by another external disturbance magnetic field source (located on the left of FIGS. 8(a) and 8(b)). These flux lines do not pass through the air gap (not in the radial direction, not in the axial direction).
Figure 8:
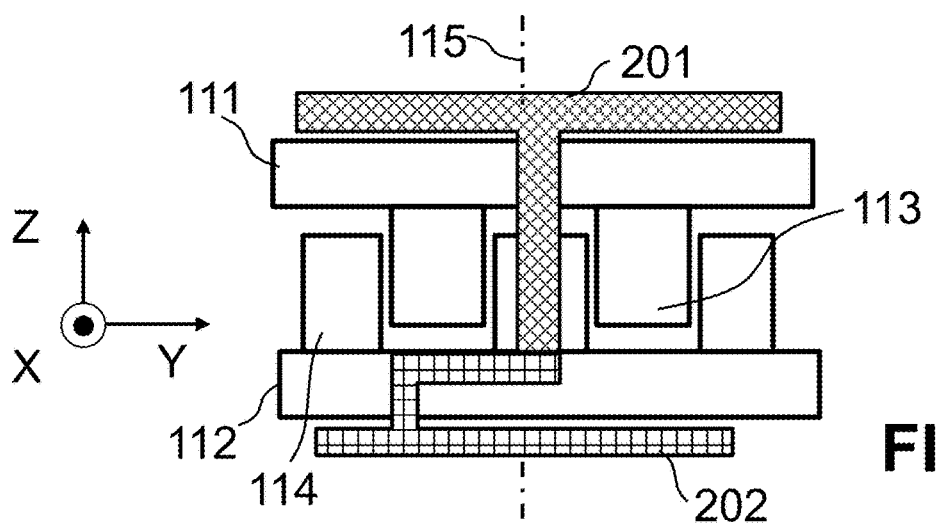

FIG. 8(a) and FIG. 8(b) illustrate a side view and a front view, respectively, of the magnetic torque sensor arrangement 200 and of the magnetic field sensor arrangement 220 shown in FIGS. 2(a) and 2(b), furthermore depicting the course of magnetic flux lines 227 generated by an external disturbance magnetic field source S3 (located on the left side of FIGS. 8(a) and 8(b)) generating a disturbance field oriented in the X direction.

As it is apparent from FIGS. 8(a) and 8(b), a disturbance magnetic flux 230 oriented in the X direction is essentially not (or at most to a very small, negligible extent) entering the air gap 203, because the majority of the flux lines enter the rings 111, 112, but leave the magnetic structure via the vertical legs of the first and second flux concentrator 201, 202. Only a minor portion of the flux entering the first ring 111 will pass through the air gap and leave the sensor structure via the second flux concentrator 202, consequently it is essentially not contributing to the overall magnetic flux sensed by the magnetic field sensor 207 in the X direction.

Since a homogeneous disturbance field oriented in any arbitrary direction can be decomposed in three orthogonal components, one oriented in the Z-direction, one oriented in the X-direction, and one oriented in the Y-direction, it can be understood from the above that the signal magnetic flux generated by the magnetic source S1, e.g. a multi-pole ring magnet, can be measured in a manner which is highly robust against an external disturbance field oriented in any arbitrary direction, because a disturbance flux in the Z-direction passes through the air-gap but is compensated, a disturbance flux oriented in the Y-direction does not pass via the air gap, and a disturbance flux in the X-direction does not, or not significantly pass through the air gap, and thus does not, or does not significantly influence the measurement of the signal generated by the first magnetic source S1.

Figure 9A:
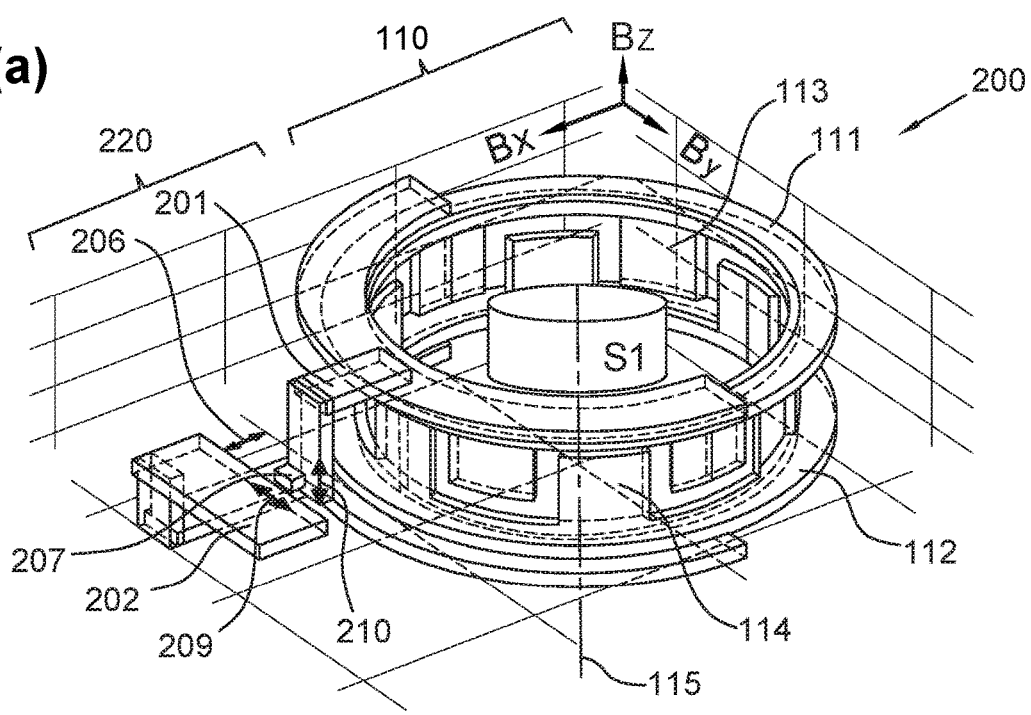
FIG. 9(a), FIG. 9(b), and FIG. 9(c) illustrate a perspective view, a side view, and a front view, respectively, of the magnetic field sensor arrangement and the angle sensor arrangement shown in FIGS. 2(a) and 2(b).
Figure 9B:
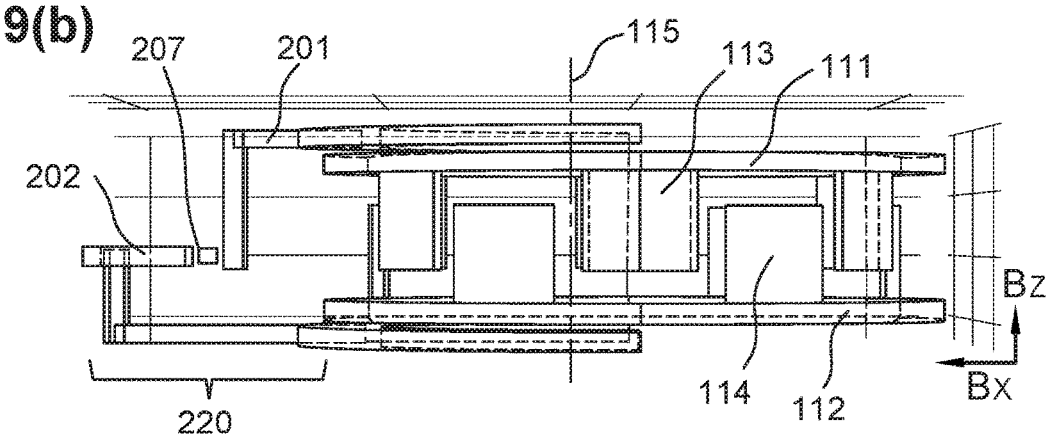
Figure 9C:
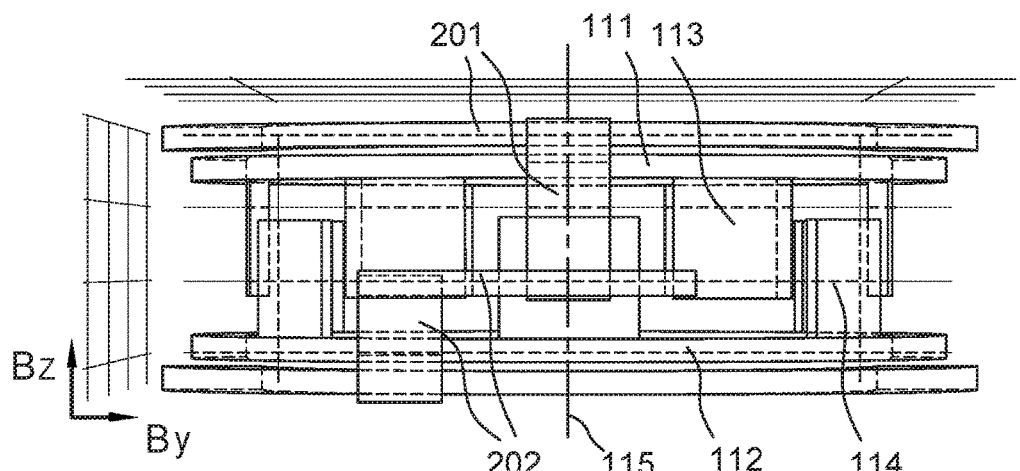

FIG. 9(a), FIG. 9(b), and FIG. 9(c) illustrate a perspective view, a side view, and a front view, respectively, of the magnetic field sensor arrangement 220 shown in FIGS. 2(a) and 2(b) suitable for being used in combination with the magnetic arrangement 110 as an angle sensor and/or as a magnetic torque sensor arrangement 200 as disclosed herein. The magnetic arrangement 110 comprises a radially magnetized multi-pole ring magnet S1 and may also further comprise a torsion bar (not shown), for example similar to, or identical to the one described in DE10222118A1, or EP3505894A1.

Figure 10A:
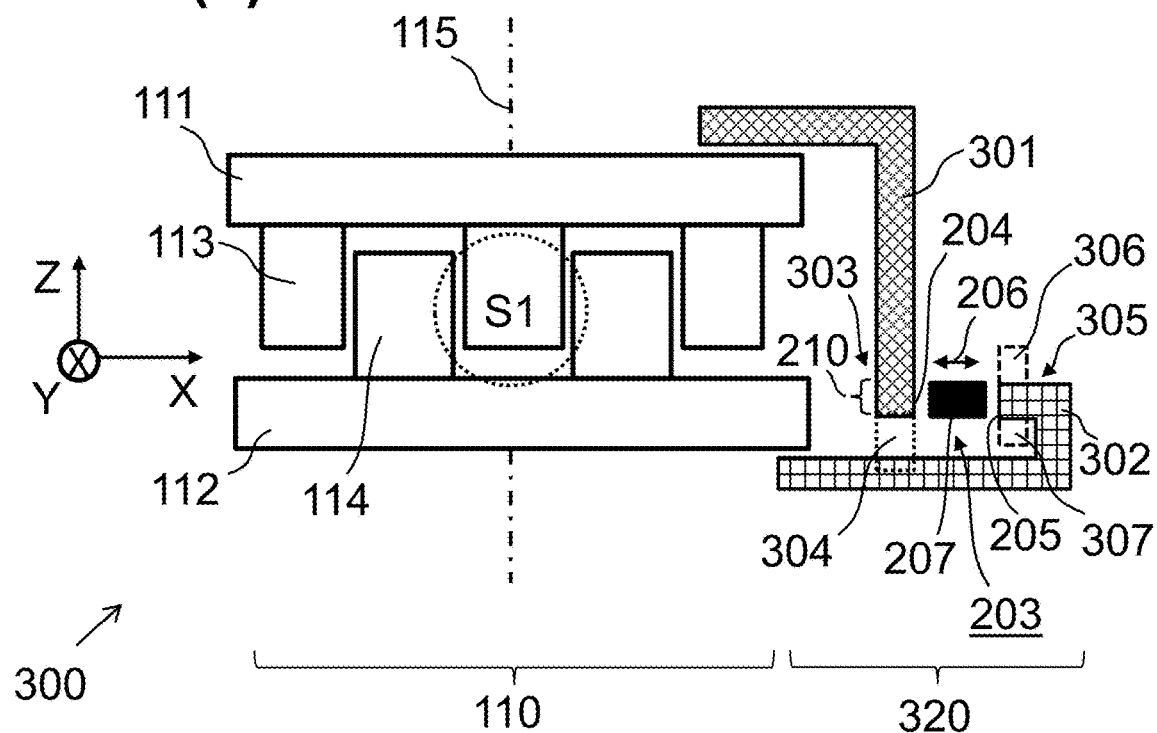
FIG. 10(a) and FIG. 10(b) illustrate a side view and a front view, respectively, of another exemplary embodiment of a magnetic field sensor arrangement according to the invention.
Figure 10B:
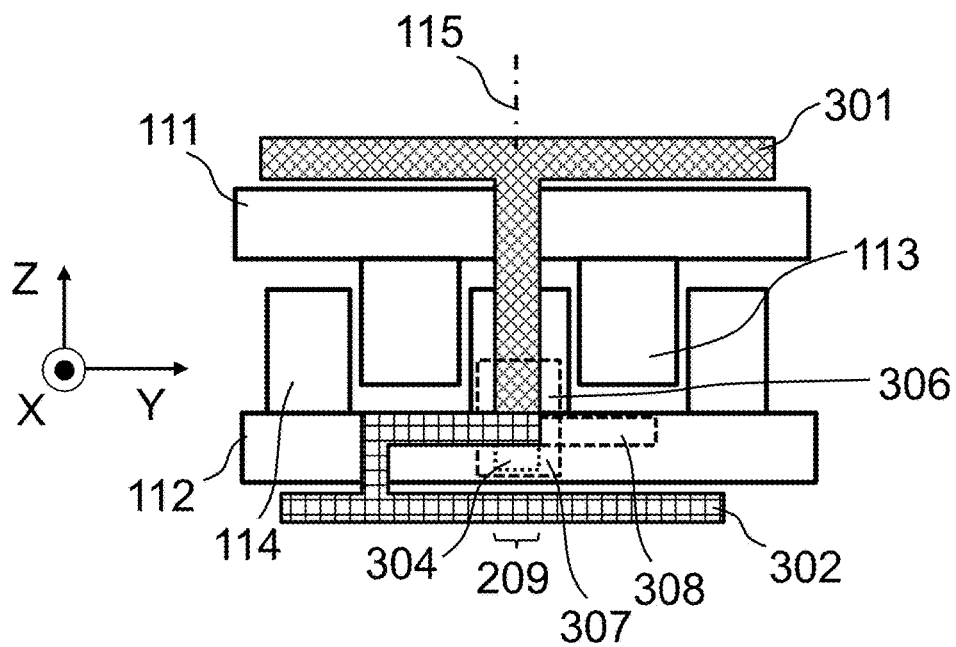

FIG. 10(a) and FIG. 10(b) illustrate a side view and a front view, respectively, of yet another exemplary embodiment of an angle sensor arrangement and/or a magnetic torque sensor arrangement 300 comprising a magnetic structure 110 as described above and a magnetic field sensor arrangement 320.

The main difference between this embodiment and the magnetic field sensor arrangement 220 of FIGS. 2(a) and 2(b) is that the exterior face 204 of a first magnetic flux concentrator 301 is provided on a section 303 of the first magnetic flux concentrator 301 comprising one fin-shaped elongation member 304, and the exterior face 205 of the second magnetic flux concentrator 302 is provided on a section 305 of the second magnetic flux concentrator 302 comprising three fin-shaped elongation members 306, 307, 308, wherein the fin-shaped elongation members 304, 306, 307, 308 extend in a direction oriented essentially perpendicular to the gap direction 206 and beyond the width 209 and/or the height 210 of the cross-sectional area of the air gap 203 in a plane perpendicular to the gap direction 206.

Figure 11A:
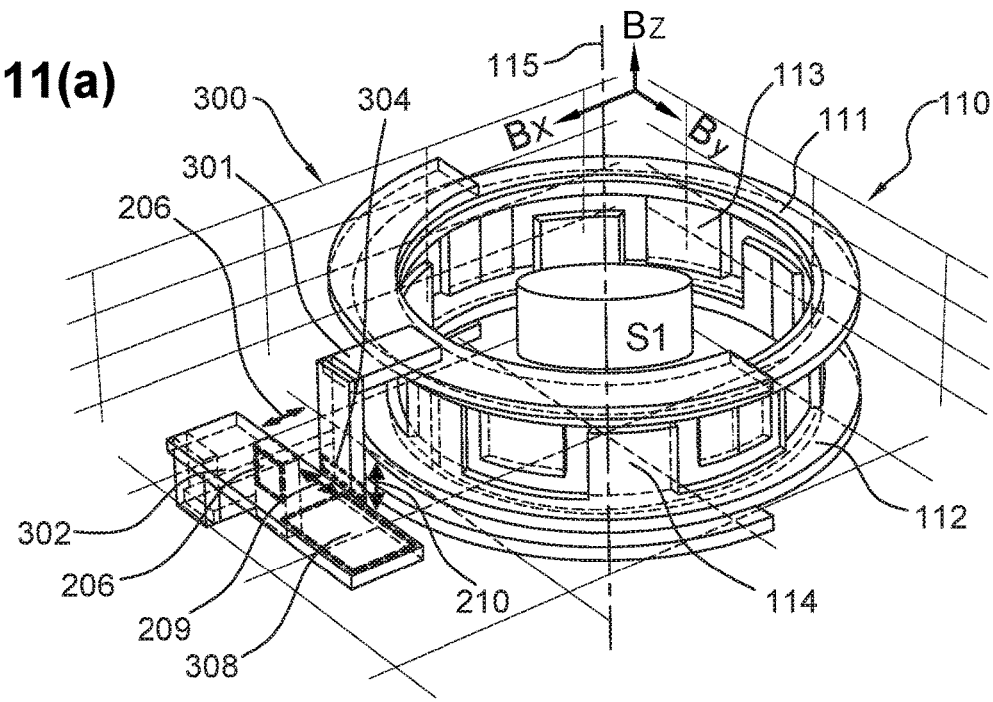
FIGS. 11(a), 11(b), and 11(c) illustrate a perspective view, a side view, and a front view, respectively, of the magnetic field sensor arrangement and the angle sensor arrangement shown in FIGS. 10(a) and 10(b).
Figure 11B:
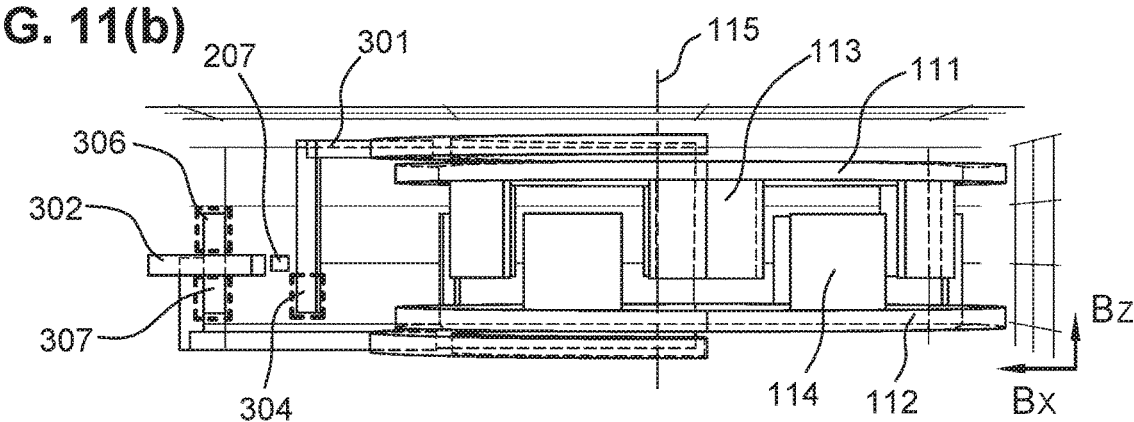
Figure 11C:
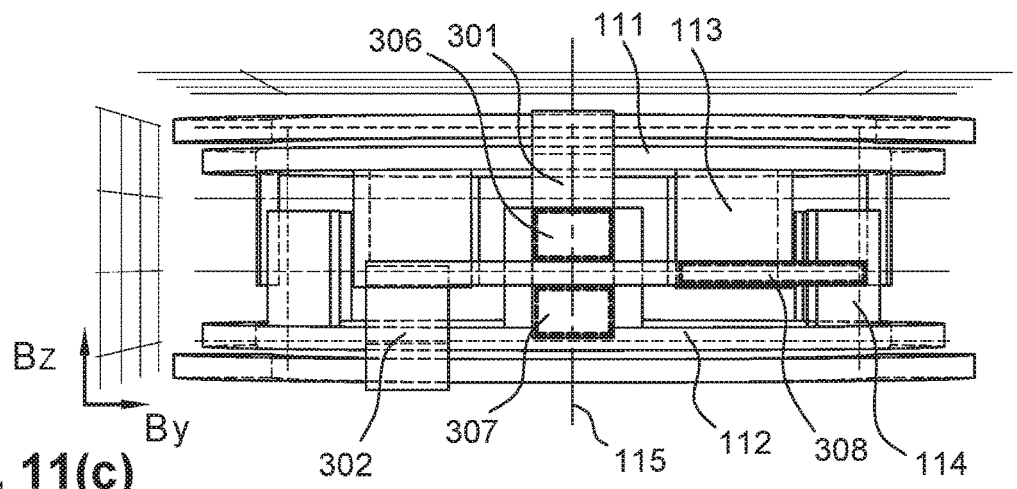

FIG. 11(a), FIG. 11(b), and FIG. 11(c) illustrate a perspective view, a side view, and a front view, respectively, of the magnetic torque sensor arrangement 300, and the magnetic field sensor arrangement 320 of FIGS. 10(a) and 10(b), used in combination with the magnetic arrangement 110.

FIG. 12 shows a flow-chart of a method 1200 for stray-field-immune determining a signal magnetic flux generated by a signal magnetic field source S1 in a manner which is highly immune to a disturbance field. The method comprises the steps of:

a) providing 1201 a magnetic structure 110 comprising a magnetic source S1 and two magnetic concentrators 111, 112 configured for guiding a magnetic flux generated by said source, and forming an air gap 203 oriented in a radial direction X with respect to the magnetic structure 110;

b) measuring 1202, inside the air gap 203, a first magnetic field component Bx oriented in the radial direction X, indicative of a combination of a signal generated by the magnetic source S1 and a first portion 228 of a disturbance field S2 oriented in the axial direction Z with respect to the magnetic structure 110;

c) measuring 1203, inside the air gap 203, a second magnetic field component Bz oriented in an axial direction Z of the magnetic structure 110, indicative of a second portion 229 of said disturbance field S2 oriented in the axial direction Z with respect to the magnetic structure 110;

d) reducing or eliminating 1204 the first disturbance portion 228 by scaling the second signal Bz with a predefined constant K, and by subtracting the scaled signal from the first signal Bx.

The method 1200 may further comprise step e) of converting 1205 the corrected first signal into an angular distance value and/or into a torque value, e.g. using a mathematical expression or a look-up table. The angular distance value may be indicative of an angular distance between the first ring 111 and the second ring 112.

A method comprising steps a) to e) is a method of measuring an angular distance and/or a method of measuring a torque value in a manner which is highly immune to a magnetic disturbance field.

While the magnetic structure 110 is described so far mainly for use in a torque sensor, that is not the only application, and the magnetic structure 110 can also be used as an angle sensor, in particular to measure an angle between the first ring 111 and the second ring 112. The present invention therefore also provides an angle sensor capable of measuring an angle between two rotatable rings 111, 112 in a manner which is highly robust against an external disturbance field.

In summary, the magnetic field sensor arrangements 220, 320, as well as the angle sensor, and the magnetic torque sensor arrangements 200, 300 disclosed herein are highly beneficial for determining a signal magnetic flux generated by a signal magnetic field source S1 without significantly being adversely affected by an external stray/disturbance magnetic field. This is due to the specific structure and specific arrangement of the first and second flux concentrators, and the arrangement of the magnetic field sensor in the air gap formed between the two flux concentrators as disclosed herein, and in particular by the radial orientation of the gap direction 206.

Although a disturbance magnetic field oriented in an arbitrary direction may superimpose the signal magnetic flux within the two flux concentrators, the present invention provides for means of correcting the measurement result containing both the signal magnetic flux and the disturbance magnetic flux sensed in the first sensing direction (in the gap direction 206) by the determination of the disturbance magnetic flux 229 outside of the two flux concentrators in the second sensing direction (perpendicular to the gap direction), and by scaling the amount of the disturbance magnetic flux sensed in the second sensing direction, and subtracting this scaled amount from the measured magnetic flux in the first sensing direction (the gap direction), to substantially obtain the signal magnetic flux generated by the signal magnetic source S1, and optionally modulated by the magnetic structure 110.

The invention claimed is:

1. A magnetic field sensor arrangement for determining a signal magnetic flux generated by a signal magnetic field source in a manner which is substantially immune against a magnetic disturbance field, the magnetic field sensor arrangement comprising:
   said signal magnetic field source;
   a first and a second magnetic flux concentrator configured and arranged such that an air gap is formed between an exterior face of the first magnetic flux concentrator and an exterior face of the second magnetic flux concentrator, wherein the first and second exterior face define a first direction of the air gap by a line of shortest distance between said exterior faces;
   wherein the first and second magnetic flux concentrator are configured for guiding a signal magnetic flux generated by the signal magnetic field source to and across the air gap substantially in the first direction;
   a magnetic field sensor comprising a plurality of sensor elements arranged inside the air gap, such that all the sensor elements of the magnetic field sensor are positioned directly between the exterior face of the first magnetic flux concentrator and the exterior face of the second magnetic flux concentrator;
   wherein the magnetic field sensor is configured for measuring a first signal indicative of a magnetic field component oriented in the first direction, and for measuring a second signal indicative of a magnetic field component oriented in a second direction substantially perpendicular to the first direction;
   wherein the magnetic field sensor is further configured for reducing or substantially eliminating an influence of a magnetic disturbance field, if present, based on the first signal and the second signal; and
   wherein the magnetic field sensor is configured to reduce or substantially eliminate the influence of said magnetic disturbance field, when present, by scaling the second signal with a predefined constant, and by subtracting the scaled signal from the first signal.

2. The magnetic field sensor arrangement according to claim 1, wherein the magnetic field sensor further comprises a processor unit and a memory unit.

3. An angle sensor arrangement, comprising:
   a magnetic field sensor arrangement according to claim 1;
   a first ring comprising a plurality of claws, the first ring being arranged adjacent the first flux concentrator;
   a second ring comprising a plurality of claws, the second ring being arranged adjacent the second flux concentrator;
   the first and second ring being movable about a rotation axis, and movable relative to each other; and
   wherein the magnetic field sensor is further configured for converting the signal magnetic flux into an angular distance signal, indicative of an angular distance between the first ring and the second ring.

4. The angle sensor arrangement according to claim 3,
   wherein the magnetic field sensor is configured for measuring the first magnetic field component in a radial direction with respect to said rotation axis; and
   wherein the magnetic field sensor is configured for measuring the second magnetic field component in an axial direction parallel to said rotation axis.

5. The angle sensor arrangement according to claim 3,
   wherein the exterior face of the first magnetic flux concentrator is provided on a section of the first magnetic flux concentrator having a protrusion or a bent portion or an L-shaped cross section in a plane containing the rotation axis and the first direction; and/or
   wherein the exterior face of the second magnetic flux concentrator is provided on a section of the second magnetic flux concentrator having an L-shaped cross section in a plane containing the rotation axis and the first direction.

6. The angle sensor arrangement according to claim 5,
   wherein the L-shaped section of the first and/or second magnetic flux concentrator comprises a long leg and a short leg, wherein the long leg is longer than the short leg and wherein the long leg is oriented essentially perpendicular to the gap direction; and/or
   wherein the exterior face of the first magnetic flux concentrator is provided on a section of the first magnetic flux concentrator forming a free end of the first magnetic flux concentrator; and/or
   wherein the exterior face of the second magnetic flux concentrator is provided on a section of the second magnetic flux concentrator forming a free end of the second magnetic flux concentrator.

7. The angle sensor arrangement according to claim 5,
   wherein the exterior face of the first magnetic flux concentrator is provided on a section of the first magnetic flux concentrator comprising at least one fin-shaped elongation member and/or the exterior face of the second magnetic flux concentrator is provided on a section of the second magnetic flux concentrator comprising at least one fin-shaped elongation member,
   wherein the at least one fin-shaped elongation member extends in a direction oriented essentially perpendicular to the first direction beyond a width and/or a height of a cross-sectional area of the air gap, wherein the cross-sectional area of the air gap extends essentially perpendicular to the first direction.

8. The angle sensor arrangement according to claim 3,
   wherein the magnetic field sensor comprises a semiconductor substrate substantially located inside the air gap, and oriented such that the axial direction is perpendicular to the semiconductor substrate, and wherein the semiconductor substrate comprises an integrated magnetic concentrator (IMC) and at least two horizontal Hall elements arranged at a periphery of the IMC; or
   wherein the magnetic field sensor comprises a semiconductor substrate substantially located inside the air gap, and oriented such that the first direction is perpendicular to the semiconductor substrate, and wherein the semiconductor substrate comprises an integrated magnetic concentrator (IMC) and at least two horizontal Hall elements arranged at a periphery of the IMC; or
   wherein the magnetic field sensor comprises a semiconductor substrate substantially located inside the air gap, and oriented such that the semiconductor substrate is perpendicular to the axial direction, and wherein the semiconductor substrate comprises a horizontal Hall element and a vertical Hall element; or wherein the magnetic field sensor comprises a semiconductor substrate substantially located inside the air gap, and oriented such that the semiconductor substrate is parallel to the axial direction and parallel to the first direction, and wherein the semiconductor substrate comprises a first vertical Hall element sensitive in the first direction, and a second vertical Hall element sensitive in the axial direction; or wherein the magnetic field sensor comprises a semiconductor substrate located inside the air gap, and oriented such that the semiconductor substrate is perpendicular to the radial direction, and wherein the semiconductor substrate comprises a horizontal Hall element and a vertical Hall element.

9. A magnetic torque sensor arrangement for stray-field-immune determining of a torque applied to a torque bar, comprising:
   an angle sensor arrangement according to claim 3;
   said torque bar having a first axial end connected to the first ring, and a second axial end connected to the second ring, such that, when a torque is applied to the torque bar, the torque bar is elastically deformed, thereby causing an angular displacement of the first and second ring as a function of the applied torque; and
   wherein the magnetic field sensor is further configured for converting the signal magnetic flux or the angular displacement into a torque value.

10. A method of determining a signal magnetic flux generated by a signal magnetic field source in a manner which is substantially immune against a magnetic disturbance field, comprising the steps of:
   a) providing a magnetic field sensor arrangement according to claim 1;
   b) measuring, by the magnetic field sensor, a first signal of a magnetic field component oriented in the first direction;
   c) measuring, by the magnetic field sensor, a second signal of a magnetic field component oriented in the second direction perpendicular to the first direction;
   d) reducing or substantially eliminating an influence of a magnetic disturbance field, if present, based on the first magnetic field component and the second magnetic field component.

11. The method according to claim 10, wherein step d) comprises: scaling the second signal with a predefined constant and subtracting the scaled signal from the first signal.

12. The method according to claim 10, wherein step d) is carried out by a processor unit and a memory unit integrated in the magnetic field sensor.

13. The method according to claim 10,
   wherein step a) further comprises: providing a first ring comprising a plurality of claws, the first ring being arranged adjacent the first flux concentrator; and providing a second ring comprising a plurality of claws, the second ring being arranged adjacent the second flux concentrator; the first and second ring being movable about a rotation axis, and movable relative to each other; and
   wherein the method further comprises the following step:
   e) converting the corrected first signal into an angle value.

14. The method according to claim 10,
   wherein step a) further comprises: providing a torque bar having a first axial end connected to the first ring, and a second axial end connected to the second ring, such that, when a torque is applied to the torque bar, the torque bar is elastically deformed, thereby causing an angular displacement of the first and second ring as a function of the applied torque; and
   wherein the method further comprises the following step:
   e) converting the corrected first signal into a torque value.

15. A magnetic field sensor arrangement for determining a signal magnetic flux generated by a signal magnetic field source in a manner which is substantially immune against a magnetic disturbance field, the magnetic field sensor arrangement comprising:
   said signal magnetic field source;
   a first and a second magnetic flux concentrator configured and arranged such that an air gap is formed between an exterior face of the first magnetic flux concentrator and an exterior face of the second magnetic flux concentrator, wherein the first and second exterior face define a first direction of the air gap by a line of shortest distance between said exterior faces;
   a first ring comprising a plurality of claws, the first ring being arranged adjacent the first flux concentrator;
   a second ring comprising a plurality of claws, the second ring being arranged adjacent the second flux concentrator;
   the first and second ring being movable about a rotation axis, and movable relative to each other; and
   wherein the first and second magnetic flux concentrator are configured for guiding a signal magnetic flux generated by the signal magnetic field source to and across the air gap substantially in the first direction, wherein the first direction is perpendicular to the rotation axis of the first and second rings;
   a magnetic field sensor comprising a plurality of sensor elements arranged inside the air gap;
   wherein the magnetic field sensor is configured for measuring a first signal indicative of a magnetic field component oriented in the first direction, and for measuring a second signal indicative of a magnetic field component oriented in a second direction substantially perpendicular to the first direction; and
   wherein the magnetic field sensor is further configured for reducing or substantially eliminating an influence of a magnetic disturbance field, if present, based on the first signal and the second signal.

* * * * *